US009960245B1

(12) United States Patent
Wang et al.

(10) Patent No.: US 9,960,245 B1
(45) Date of Patent: May 1, 2018

(54) TRANSISTOR DEVICE HAVING PROTRUDING PORTION FROM CHANNEL PORTION

(71) Applicant: Industrial Technology Research Institute, Hsinchu (TW)

(72) Inventors: Tai-Jui Wang, Kaohsiung (TW); Tsu-Chiang Chang, New Taipei (TW); Chieh-Wei Feng, Taoyuan (TW); Shao-An Yan, New Taipei (TW); Wei-Han Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days. days.

(21) Appl. No.: 15/458,984

(22) Filed: Mar. 15, 2017

(30) Foreign Application Priority Data

Dec. 15, 2016 (TW) .............................. 105141523 A

(51) Int. Cl.
*H01L 29/76* (2006.01)
*H01L 29/423* (2006.01)
(Continued)

(52) U.S. Cl.
CPC .. *H01L 29/42384* (2013.01); *H01L 29/41733* (2013.01); *H01L 29/66757* (2013.01); *H01L 29/78675* (2013.01); *H01L 29/78696* (2013.01)

(58) Field of Classification Search
CPC ......... H01L 29/42384; H01L 29/41733; H01L 29/66757; H01L 29/78675;
(Continued)

(56) References Cited

U.S. PATENT DOCUMENTS 7,221,012 B2  5/2007  Chu et al.
7,491,592 B2  2/2009  Chen et al.
(Continued)

FOREIGN PATENT DOCUMENTS

CN   101752424   6/2010
CN   105140208   12/2015
(Continued)

OTHER PUBLICATIONS

Tai-Jui Wang, et al., "Semiconductor Device," Unpublished U.S. Appl. No. 15/209,780, filed Jul. 14, 2016.
(Continued)

*Primary Examiner* — Shahed Ahmed
(74) *Attorney, Agent, or Firm* — JCIPRNET

(57) ABSTRACT

A transistor device including a semiconductor material layer, a gate layer, and an insulation layer between the gate layer and the semiconductor material layer is provided. The semiconductor material layer includes a first conductive portion, a second conductive portion, a channel portion between the first conductive portion and the second conductive portion, and a first protruding portion formed integrally. The channel portion has a first boundary adjacent to the first conductive portion, a second boundary adjacent to the second conductive portion, a third boundary, and a fourth boundary. The third boundary and the fourth boundary connect the terminals of the first boundary and the second boundary. The first protruding portion is protruded outwardly from the third boundary of the channel portion. The first gate boundary and the second gate boundary are overlapped with the first boundary and the second boundary of the channel portion.

19 Claims, 19 Drawing Sheets

(51) Int. Cl.
*H01L 29/786* (2006.01)
*H01L 29/66* (2006.01)
*H01L 29/417* (2006.01)

(58) Field of Classification Search
CPC ........... H01L 29/78696; H01L 27/1251; H01L 27/3274; H01L 29/1025; H01L 29/1037; H01L 21/823412; H01L 21/823807; H01L 21/823885
USPC ......... 257/288, 368, 369; 438/151, 197, 199
See application file for complete search history.

(56) References Cited

U.S. PATENT DOCUMENTS

| | | | |
|---|---|---|---|
| 7,551,255 B2 | 6/2009 | Jeong et al. | |
| 7,812,344 B2 | 10/2010 | Yan et al. | |
| 8,373,168 B2 | 2/2013 | Yan et al. | |
| 9,252,165 B2 | 2/2016 | Yan et al. | |
| 9,368,441 B2 | 6/2016 | Yan et al. | |
| 9,391,208 B2 | 7/2016 | Yan et al. | |
| 2005/0045963 A1* | 3/2005 | Lau ....................... | H01L 27/115 257/374 |
| 2006/0243974 A1 | 11/2006 | Su et al. | |
| 2007/0243670 A1* | 10/2007 | Chen ....................... | H01L 29/04 438/149 |
| 2010/0127270 A1 | 5/2010 | Yan et al. | |
| 2011/0168893 A1 | 7/2011 | Swank et al. | |
| 2013/0032866 A1 | 2/2013 | Godo | |
| 2013/0222219 A1 | 8/2013 | Saitoh et al. | |
| 2014/0110715 A1 | 4/2014 | Lai et al. | |
| 2014/0131678 A1 | 5/2014 | Lee | |
| 2015/0162354 A1* | 6/2015 | Jo ....................... | H01L 27/1259 257/72 |

FOREIGN PATENT DOCUMENTS

| | | |
|---|---|---|
| CN | 105845691 | 8/2016 |
| TW | I343129 | 6/2011 |
| TW | 201216474 | 4/2012 |
| TW | 201434077 | 9/2014 |
| TW | I555124 | 10/2016 |
| TW | I555150 | 10/2016 |

OTHER PUBLICATIONS

Tai-Jui Wang et al., "Semiconductor Device", Unpublished Taiwan application No. 105115124, Filed on May 17, 2016. pp. 1-73.
Tai-Jui Wang et al., "Semiconductor Device", Unpublished China application No. 201610051732.2, Filed on Jul. 18, 2016. pp. 1-42.
"Office Action of Taiwan Counterpart Application," dated Jul. 11, 2017, p. 1-p. 7.

* cited by examiner

TRANSISTOR DEVICE HAVING PROTRUDING PORTION FROM CHANNEL PORTION

CROSS-REFERENCE TO RELATED APPLICATION

This application claims the priority benefit of Taiwan application serial no. 105141523, filed on Dec. 15, 2016. The entirety of the above-mentioned patent application is hereby incorporated by reference herein and made a part of this specification.

TECHNICAL FIELD

The disclosure relates to an electronic element, and more particularly, to a transistor device.

BACKGROUND

With the development of the manufacturing techniques of electronic elements, the research and development of flexible electronic products are becoming more and more vigorous. The main issue that flexible electronic products such as flexible display panels need to overcome is that the electronic products are constantly bent during use such that elements in the electronic products may be readily damaged due to stress. In particular, electronic elements require a semiconductor material to achieve the performance of the product. The conductive properties (or semiconductor properties) of many semiconductor materials may be changed after stress is applied, such that the operating stability of the electronic elements readily becomes poor. For instance, by using a semiconductor material as the channel layer of the transistor element, the phenomenon of conduction voltage (or threshold voltage) offset or the phenomenon of leakage current may occur due to stress.

SUMMARY

A transistor device of the disclosure includes a semiconductor material layer, a gate layer, and an insulating layer. The semiconductor material layer includes a first conductive portion, a second conductive portion, a channel portion, and a first protruding portion formed integrally. The channel portion is located between the first conductive portion and the second conductive portion. The channel portion has a first boundary, a second boundary, a third boundary, and a fourth boundary, wherein the first boundary is adjacent to the first conductive portion, the second boundary is adjacent to the second conductive portion, and the third boundary and the fourth boundary connect the terminals of the first boundary and the second boundary. The first protruding portion is protruded outwardly from the third boundary of the channel portion. The gate layer is extended across and overlapped with the channel portion. The first gate boundary and the second gate boundary of the gate layer are overlapped with the first boundary and the second boundary of the channel portion. The insulating layer is disposed between the gate layer and the semiconductor material layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
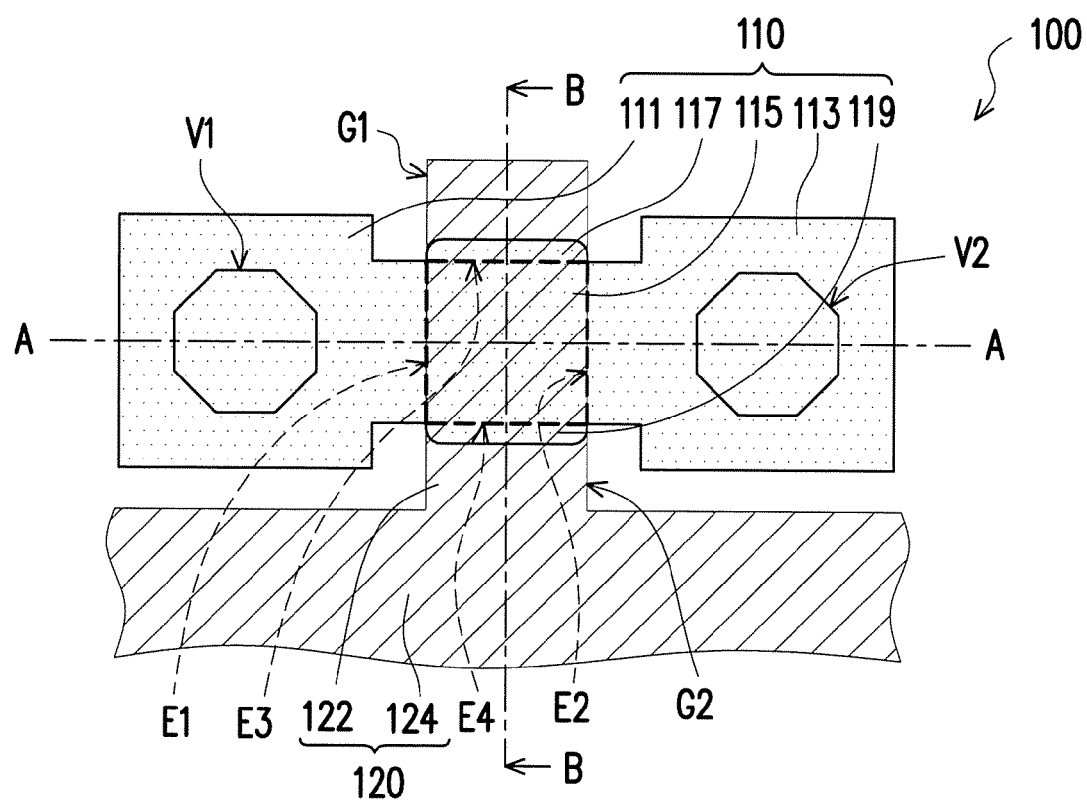
FIG. 1 is a top schematic view of a transistor device of an embodiment of the disclosure.
Figure 2:
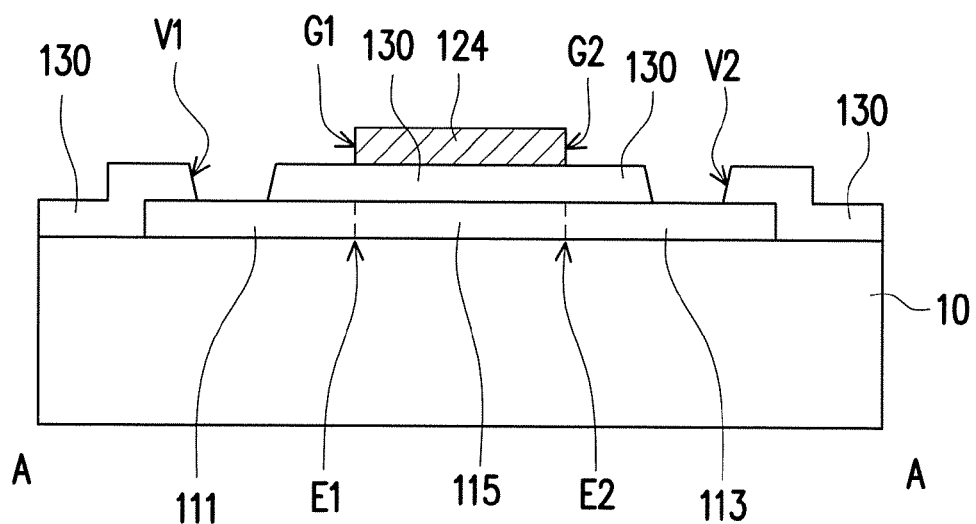
FIG. 2 is a cross-sectional schematic view of line A-A of FIG. 1.
Figure 3:
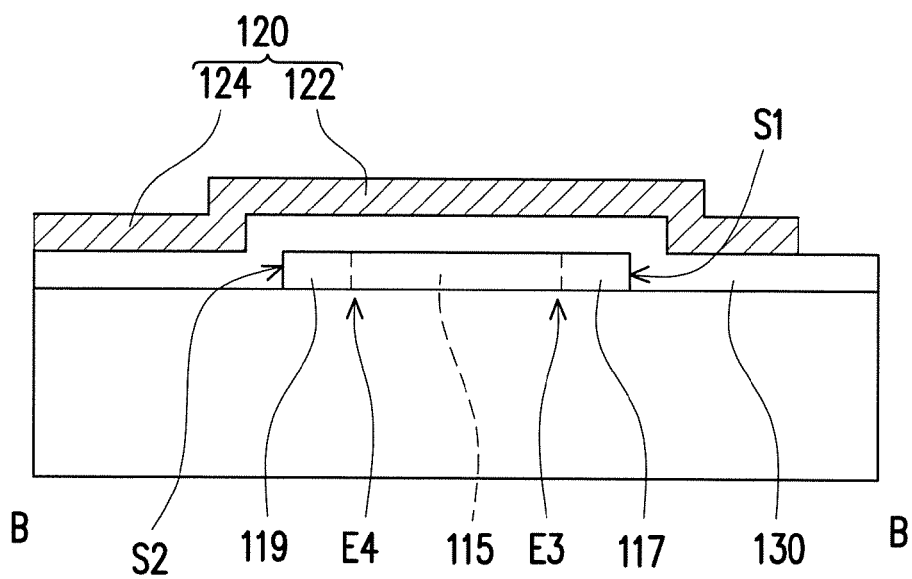
FIG. 3 is a cross-sectional schematic view of line B-B of FIG. 1.

FIG. 1 is a top schematic view of a transistor device of an embodiment of the disclosure, FIG. 2 is a cross-sectional schematic view of line A-A of FIG. 1, and FIG. 3 is a cross-sectional schematic view of line B-B of FIG. 1. Referring to all of FIG. 1 to FIG. 3, a transistor device 100 as an element having switch function could be disposed on a substrate 10. The transistor device 100 includes a semiconductor material layer 110, a gate layer 120, and an insulating layer 130. The semiconductor material layer 110 could be directly disposed on the substrate 10, however, in other embodiments, other layers may be interposed between the semiconductor material layer 110 and the substrate 10, such as a buffer layer. The semiconductor material layer 110 includes a first conductive portion 111, a second conductive portion 113, and a channel portion 115, wherein the first conductive portion 111 and the second conductive portion 113 are located at two sides of the channel portion 115. The gate layer 120 and the channel portion 115 of the semiconductor material layer 110 are overlapped. The insulating layer 130 is disposed between the gate layer 120 and the semiconductor material layer 110. When the switch function is achieved, a desired voltage could be applied to the gate layer 120 such that the channel portion 115 of the semiconductor material layer 110 is subjected to the electric field effect of the gate layer 120 to allow electrical transmission between the first conductive portion 111 and the second conductive portion 113.

The semiconductor material layer 110 further includes a first protruding portion 117 and a second protruding portion 119. The first conductive portion 111, the second conductive portion 113, the channel portion 115, the first protruding portion 117, and the second protruding portion 119 are physically connected to one another and integrally form the semiconductor material layer 110. In other embodiments, the semiconductor material layer 110 could also include other components and is not limited to the above. The channel portion 115 is located between the first conductive portion 111 and the second conductive portion 113 and also located between the first protruding portion 117 and the second protruding portion 119.

The gate layer 120 includes a gate 122 and a gate line 124. The gate 122 is a branch protruded from the gate line 124, and the gate 122 is extended across and overlapped with the channel portion 115. Moreover, the insulating layer 130 could have an opening V1 exposing the first conductive portion 111 and an opening V2 exposing the second conductive portion 113 such that the first conductive portion 111 and the second conductive portion 113 could be connected to other components therethrough. The material of the insulating layer 130 could be an inorganic insulating material such as silicon oxide, silicon nitride, or silicon oxynitride, and could also be organic insulating materials, or stacked layers of the insulating materials. In other embodiments, the insulating layer 130 may not have the opening V1 and the opening V2, such that the insulating layer 130 continuously covers the semiconductor material layer 110.

The channel portion 115 has a first boundary E1, a second boundary E2, a third boundary E3, and a fourth boundary E4. The channel portion 115 is adjacent to the first conductive portion 111 at the first boundary E1, adjacent to the second conductive portion 113 at the second boundary E2, and respectively adjacent to the first protruding portion 117 and the second protruding portion 119 at the third boundary E3 and the fourth boundary E4. In other words, the first conductive portion 111 and the second conductive portion 113 are respectively protruded outwardly from the first boundary E1 and the second boundary E2 and the first protruding portion 117 and the second protruding portion 119 are respectively protruded outwardly from the third boundary E3 and the fourth boundary E4, wherein protruded outwardly refers to a protruding direction away from the channel portion 115. Here, the first conductive portion 111, the second conductive portion 113, the channel portion 115, the first protruding portion 117, and the second protruding portion 119 are integrally formed, and therefore the first boundary E1, the second boundary E2, the third boundary E3, and the fourth boundary E4 are not boundaries of a physical structure, but are defined by the functions of different portions in the semiconductor material layer 110.

For the first boundary E1 and the second boundary E2, the first conductive portion 111 and the second conductive portion 113 are used as the source and the drain in the transistor device 100, and the channel portion 115 is used as the channel controlling the on and off of the transistor device 100. As a result, the conductive properties such as the electric conductivities of the first conductive portion 111 and the second conductive portion 113 are greater than that of the channel portion 115. As a result, the first boundary E1 and the second boundary E2 could be defined by the junction of two portions having different conductive properties in the semiconductor material layer 110. Moreover, in the present embodiment, a first gate boundary G1 and a second gate boundary G2 defining the gate line 124 in the gate layer 120 are respectively overlapped with the first boundary E1 and the second boundary E2 of the channel portion 115, and therefore the first boundary E1 and the second boundary E2 could also be determined by the outline of the gate layer 120.

Moreover, the channel portion 115, the first protruding portion 117, and the second protruding portion 119 could have the same conductive properties such as electric conductivities and may not be differentiated by the conductive properties. Therefore, in the present embodiment and the following embodiments, the third boundary E3 and the fourth boundary E4 are both defined by the connecting line connecting the terminals of the first boundary E1 and the second boundary E2 to difine the boundaries of the first protruding portion 117 and the second protruding portion 119 adjacent to the channel portion 115. Moreover, during the operation of the transistor device 100, the current densities in the first protruding portion 117 and the second protruding portion 119 are less than the current density of the channel portion 115, and therefore the third boundary E3 between the first protruding portion 117 and the channel portion 115 and the fourth boundary E4 between the second protruding portion 119 and the channel portion 115 could also be determined by measuring the current distribution of the semiconductor material layer 110. In other words, during the operation of the transistor device 100, the first protruding portion 117 and the second protruding portion 119 generally do not provide the function of a channel.

It could be known from FIG. 1 and FIG. 3 that, the first protruding portion 117 is protruded outwardly from the third boundary E3, the second protruding portion 119 is protruded outwardly from the fourth boundary E4, and the boundaries of the first protruding portion 117 and the second protruding portion 119 form a portion of the physical boundary of the semiconductor material layer 110. Therefore, the boundaries of the first protruding portion 117 and the second protruding portion 119 respectively have a sidewall S1 and a sidewall S2 in structure. When the transistor device 100 is bent during use, the stress concentration region often occurs at the sidewall S1 and the sidewall S2. In the present embodiment, since the sidewall S1 and the third boundary E3 are spaced apart by a distance and the sidewall S2 and the fourth boundary E4 are spaced apart by a distance, stress concentration effect at the third boundary E1 and the fourth boundary E2 could have less influence on the channel portion 115. As a result, the transistor device 100 could have better reliability, and the transistor device 100 has better performance when applied in a flexible electronic element.

In the present embodiment, the material of the semiconductor material layer 110 could be polysilicon, but in other embodiments, the material could also be other silicon semiconductor, organic semiconductor, or oxide semiconductor materials. In the case of polysilicon material, during the manufacturing process of the transistor device 100, a polysilicon island object having the desired shape such as the shape of the semiconductor material layer 110 of FIG. 1 could first be formed on the substrate 10. Next, a doping process could be performed to introduce a conductive dopant/impurity into the first conductive portion 111 and the second conductive portion 113. The doping procedure could be achieved by a selective doping technique, in other words, in the doping process, only the first conductive portion 111 and the second conductive portion 113 are doped, and the channel portion 115, the first protruding portion 117, and the second protruding portion 119 are not doped.

In an embodiment, the doping process could be performed after the gate layer 120 is formed. At this point, the gate layer 120 could provide a shielding effect such that the portion in the polysilicon island object shielded by the gate layer 120 is not doped to form the channel portion 115, the first protruding portion 117, and the second protruding portion 119, and the portion in the polysilicon island object not shielded by the gate layer 120 is doped to form the first conductive portion 111 and the second conductive portion 113. The method allows the self-alignment of the contour of the gate layer 120 and the contour of the channel portion 115.

In another embodiment, a photoresist pattern could be optionally formed on the polysilicon island object after the manufacture of the polysilicon island object is complete to provide a shielding effect, and with the disposition of the photoresist pattern, the portion in the polysilicon island object shielded by the photoresist pattern is not doped so as to form the channel portion 115, the first protruding portion 117, and the second protruding portion 119, and the portion in the polysilicon island object not shielded by the photoresist pattern is doped to form the first conductive portion 111 and the second conductive portion 113. At this point, in the subsequent step of manufacturing the gate layer 120, the gate layer 120 could be formed by using a photomask corresponding to the photoresist pattern such that the contour of the gate layer 120 and the contour of the channel portion 115 are aligned, but the disclosure is not limited thereto.

The transistor device 100 of FIG. 1 only schematically describes one embodiment of the disclosure, and in other embodiments, the contours of the semiconductor material layer 110 and the gate layer 120 could be changed with different designs. In the following, a number of other designs of the transistor device is exemplified in top views, but based on the spirit of the disclosure, the transistor device could contain structures of a transistor device achieving the spirit of the disclosure that are not shown in the figures but are obvious to those skilled in the art. Moreover, although the top views in the figures do not show the insulating layer of the transistor device, it should be understood that, in the following embodiments, an insulating layer is disposed between the gate layer and the semiconductor material layer (as shown in FIG. 2 and FIG. 3). Moreover, in the following embodiments, components labeled by the same reference numerals have the same function and also have the same structural design.

Figure 4:
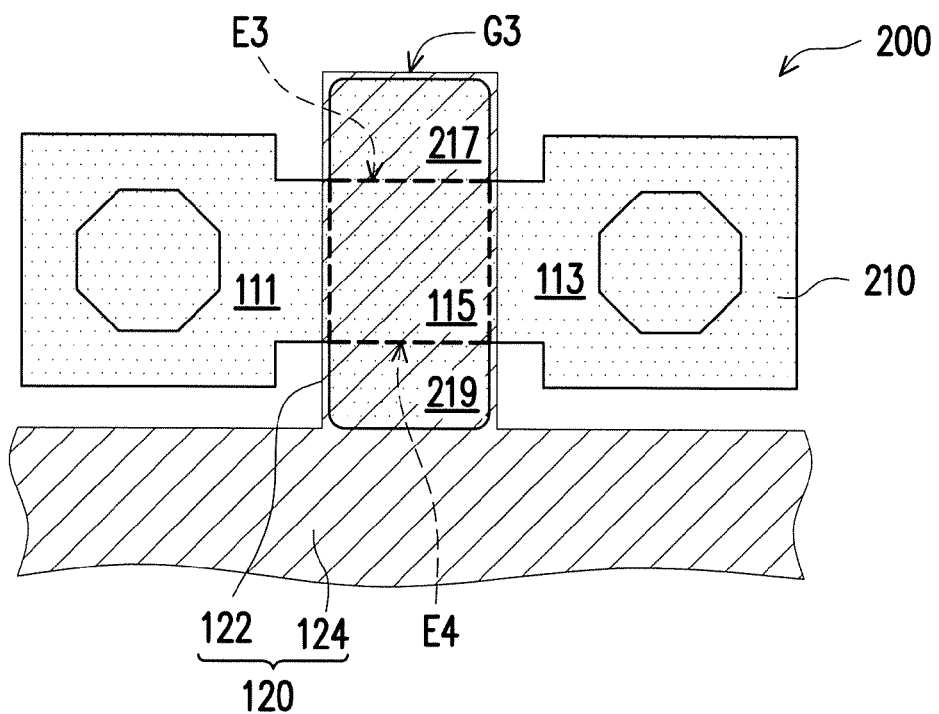
FIG. 4 to FIG. 38 are top schematic views of the transistor devices of several embodiments of the disclosure.

In FIG. 4, a transistor device 200 is viewed from the top, and the design of the gate layer 120 thereof is as shown in the embodiment of FIG. 1, and the first conductive portion 111, the second conductive portion 113, and the channel portion 115 are also as shown in the embodiment of FIG. 1. In the present embodiment, the first protruding portion 217 and the second protruding portion 219 are respectively protruded outwardly from the third boundary E3 and the fourth boundary E4 of the channel portion 115, and the boundaries of the first protruding portion 217 and the second protruding portion 219 are substantially aligned with the boundary of the gate 122. In FIG. 4, to distinguish the boundaries of the gate 122, the first protruding portion 217, and the second protruding portion 219, the boundary of the gate 122 is drawn slightly shifted outwardly, but, in the actual structural design, the boundaries of the first protruding portion 217 and the second protruding portion 219 are substantially coincided or aligned with the boundary of the gate 122. In other words, a third gate boundary G3 of the gate 122 is substantially overlapped with the boundary of the first protruding portion 217.

Figure 5:
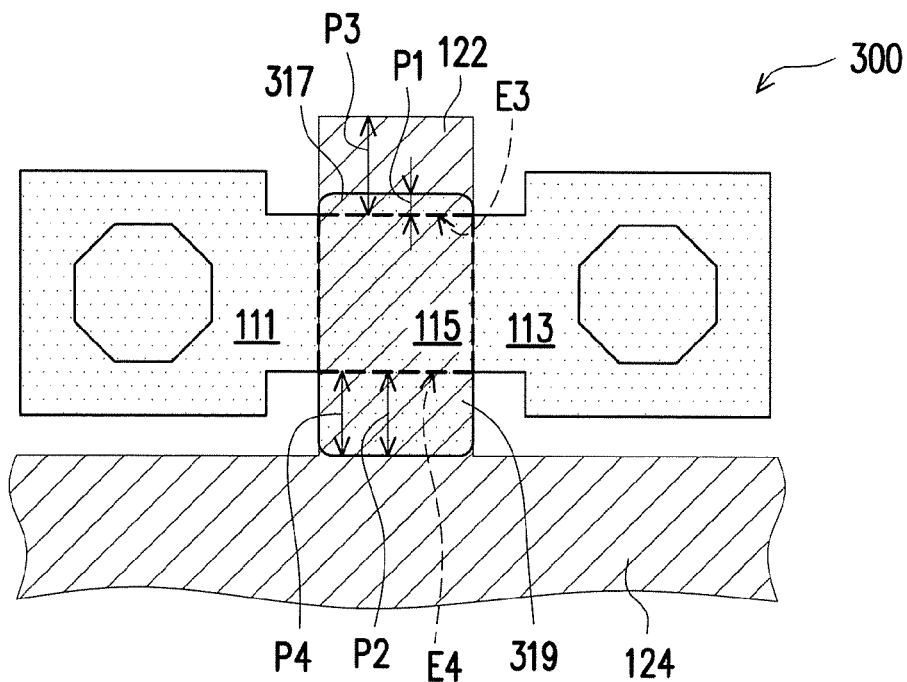

In FIG. 5, a transistor device 300 is similar to the transistor device 200. However, a protruding width P1 (the first protruding width) of a first protruding portion 317 protruded from the third boundary E3 of the channel portion 115 could be different from a protruding width P2 (the second protruding width) of a second protruding portion 319 protruded from the fourth boundary E4 of the channel portion 115. Here, the distance P1 is less than the distance P2 as an example. Moreover, in the transistor device 300, a protruding width P3 of the gate 122 protruded outwardly from the third boundary E3 of the channel portion 115 could be greater than the protruding width P1 of the first protruding portion 317 protruded from the third boundary E3 of the channel portion 115, and a protruding width P4 of the gate 122 protruded from the fourth boundary E4 of the channel portion 115 toward the gate line 124 could be substantially the same as the protruding width P2 of the second protruding portion 319 protruded from the fourth boundary E4 of the channel portion 115. Therefore, the area of the gate 122 is protruded outwardly from the first protruding portion 317 such that the first protruding portion 317 is completely covered by the gate 122, and the second protruding portion 319 is extended toward the gate line 124 such that the boundary of the second protruding portion 319 is overlapped with the junction of the gate line 124 and the gate 122.

Figure 6:
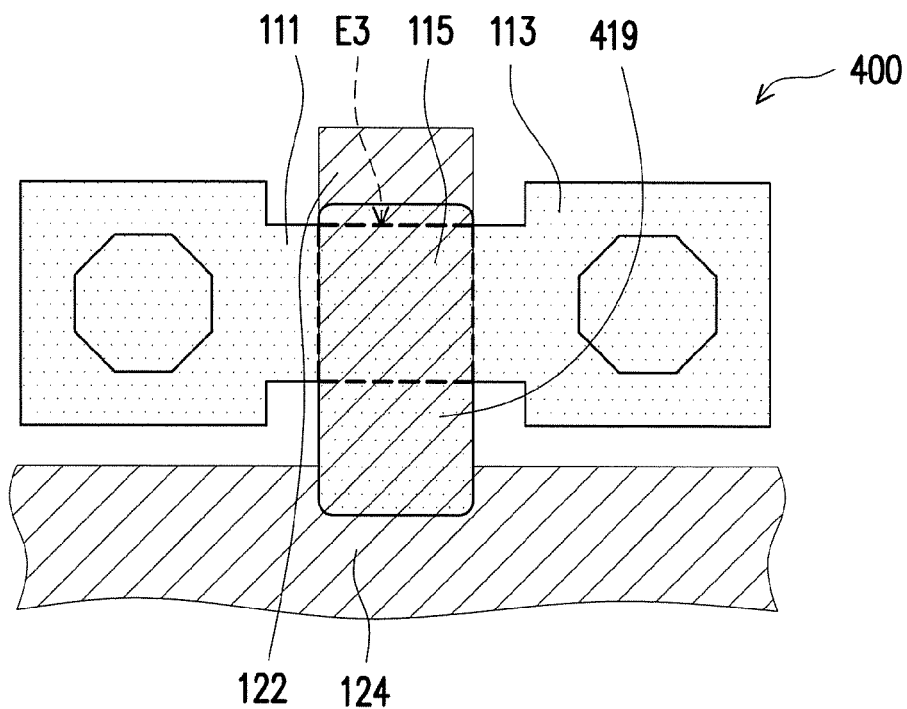
Figure 7:
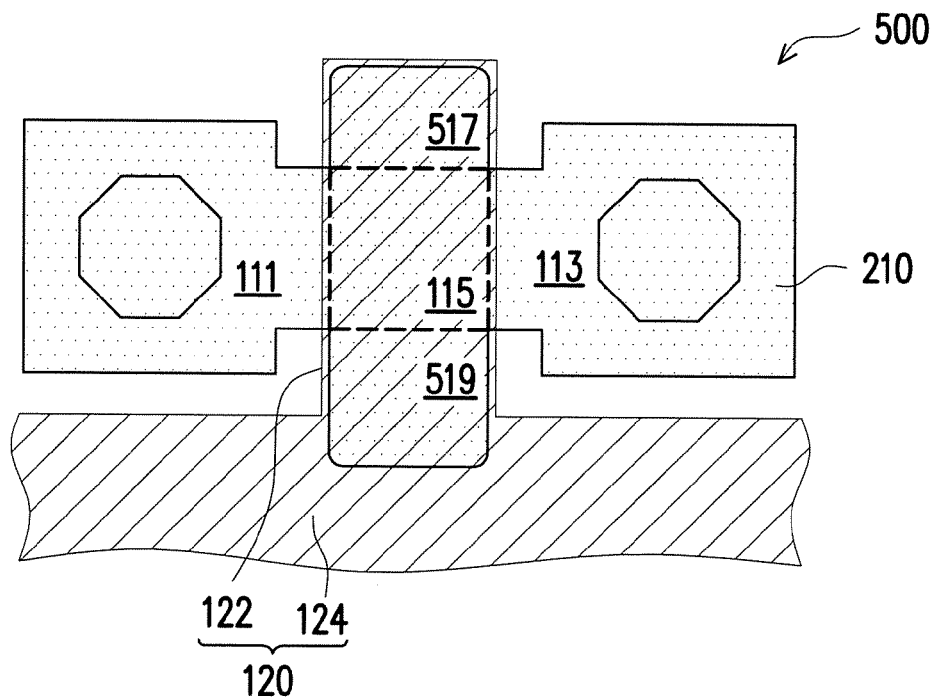

In FIG. 6, a transistor device 400 is substantially similar to the transistor device 300, but a second protruding portion 419 of the transistor device 400 is further extended in the gate line 124 to be partially overlapped with the gate line 124. In FIG. 7, a transistor device 500 is substantially similar to the transistor device 400, but a first protruding portion 517 of the transistor device 500 is extended to the boundary thereof to be overlapped with the boundary of the gate 122 (similar to the embodiment of FIG. 4). Moreover, in FIG. 7, to distinguish the boundaries of the gate 122, the first protruding portion 517, and a second protruding portion 519, the boundary of the gate 122 is slightly shifted outwardly, but, in the physical structural design, the boundaries of the first protruding portion 517 and the second protruding portion 519 are substantially coincided or aligned with the boundary of the gate 122.

Figure 8:
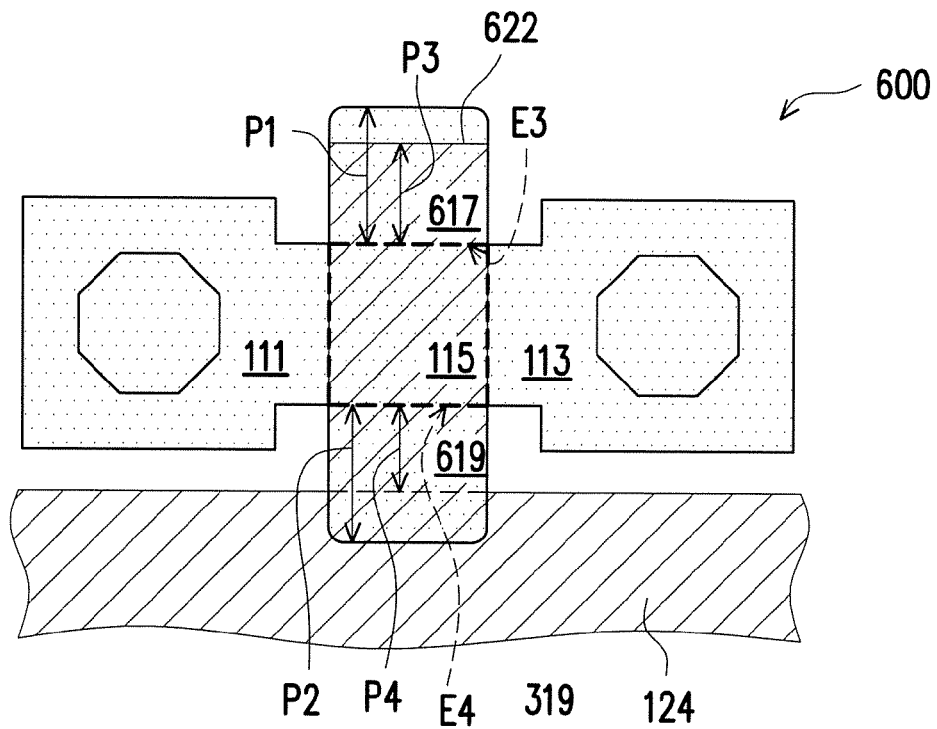

In a transistor device 600 of FIG. 8, the protruding width P3 of a gate 622 protruded outwardly from the third boundary E3 of the channel portion 115 is less than the protruding width P1 of a first protruding portion 617 protruded outwardly from the third boundary E3 of the channel portion 115, such that the first protruding portion 617 has a portion not shielded by the gate 622. Moreover, the protruding width P4 of the gate 622 protruded from the fourth boundary E4 of the channel portion 115 toward the gate line 124 is less than the protruding width P2 of a second protruding portion 619 protruded outwardly from the fourth boundary E4 of the channel portion 115, such that the second protruding portion 619 is partially extended in the gate line 124 to be overlapped with the gate line 124.

Figure 9:
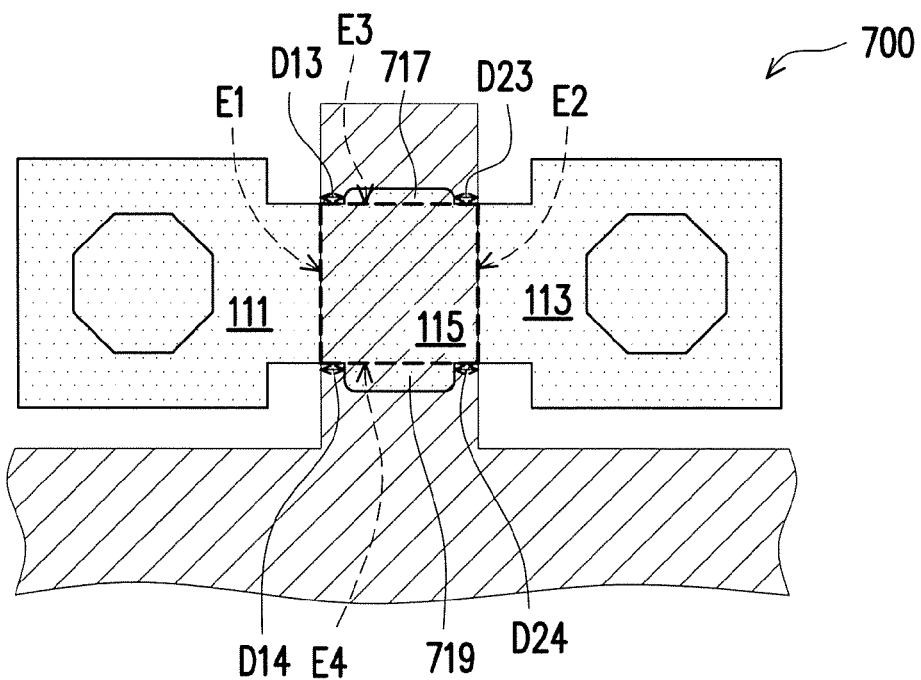

In the above embodiments, the first protruding portion is continuously extended from the first boundary to the second boundary of the channel portion, and therefore in the all of the above embodiments, the connection length of the first protruding portion connected to the third boundary is equal to the third boundary of the channel portion as an example, and the connection length of the second protruding portion connected to the fourth boundary is also equal to the fourth boundary of the channel portion as an example, but the disclosure is not limited thereto. In a transistor device 700 of FIG. 9, the connection length of a first protruding portion 717 connected to the third boundary E3 is less than the length of the third boundary E3 of the channel portion 115, and the connection length of a second protruding portion 719 connected to the fourth boundary E4 is less than the length of the fourth boundary E4 of the channel portion 115. Therefore, the first protruding portion 717 is spaced apart from the first boundary E1 of the channel portion 115 by a distance D13 and the first protruding portion 717 is spaced apart from the second boundary E2 of the channel portion 115 by a distance D23. Moreover, the second protruding portion 719 is spaced apart from the first boundary E1 of the channel portion 115 by a distance D14 and the second protruding portion 719 is spaced apart from the second boundary E2 of the channel portion 115 by a distance D24. The distances D13, D23, D14, and D24 could all be the same, or at least two of the distances D13, D23, D14, and D24 are different.

Figure 10:
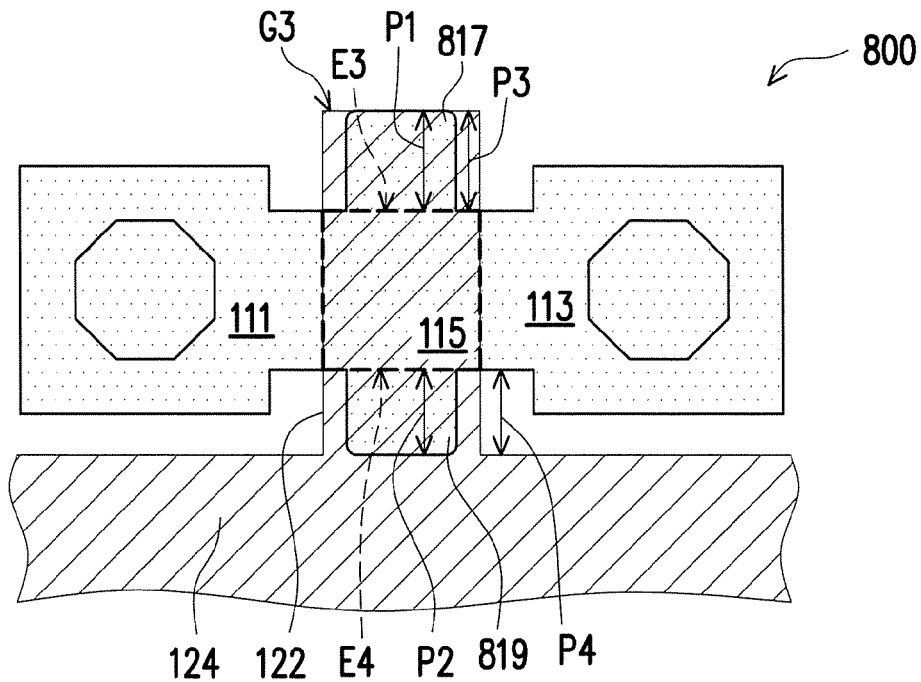

In a transistor device 800 of FIG. 10, the connection length of a first protruding portion 817 connected to the third boundary E3 is less than the length of the third boundary E3 of the channel portion 115, and the protruding width P1 of the first protruding portion 817 protruded outwardly from the third boundary E3 of the channel portion 115 is equal to the protruding width P3 of the gate 122 protruded outwardly from the third boundary E3 of the channel portion 115. Therefore, a portion of the boundary of the first protruding portion 817 at an end is overlapped with the third gate boundary G3 of the gate 122. Moreover, the connection length of a second protruding portion 819 connected to the fourth boundary E4 is less than the length of the fourth boundary E4 of the channel portion 115, and the protruding width P2 of the second protruding portion 819 protruded outwardly from the fourth boundary E4 of the channel portion 115 is equal to the protruding width P4 of the gate 122 protruded from the fourth boundary E4 of the channel portion 115 toward the gate line 124. At this point, a portion of the boundary of the second protruding portion 819 at an end could be overlapped with the junction of the gate 122 and the gate line 124.

Figure 11:
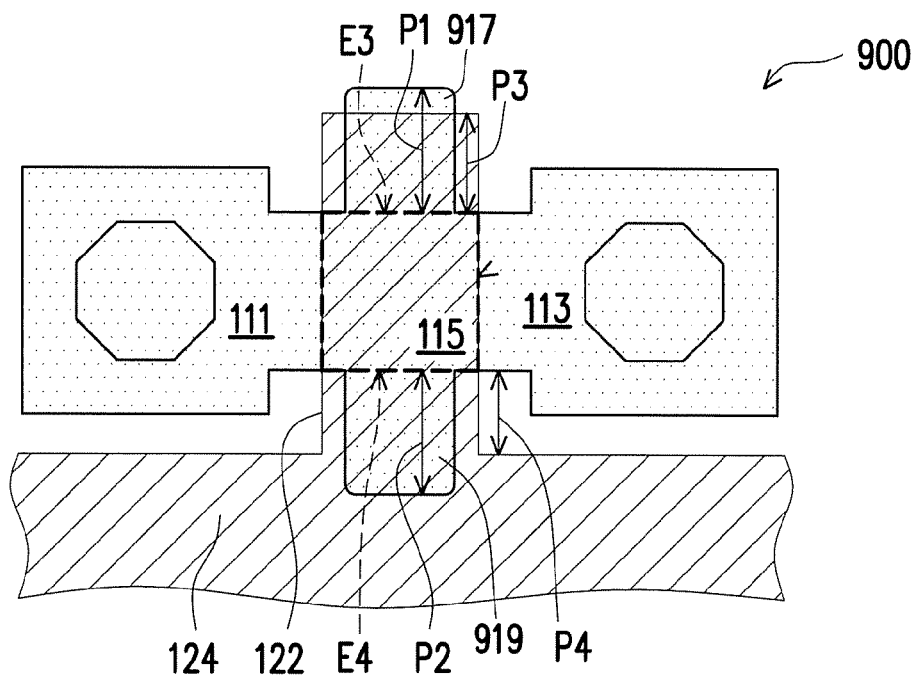

In a transistor device 900 of FIG. 11, the connection length of a first protruding portion 917 connected to the third boundary E3 is less than the length of the third boundary E3 of the channel portion 115, and the connection length of a second protruding portion 919 connected to the fourth boundary E4 is less than the length of the fourth boundary E4 of the channel portion 115. Moreover, the protruding width P1 of the first protruding portion 917 protruded outwardly from the third boundary E3 of the channel portion 115 is greater than the protruding width P3 of the gate 122 protruded outwardly from the third boundary E3 of the channel portion 115, and the protruding width P2 of the second protruding portion 919 protruded outwardly from the fourth boundary E4 of the channel portion 115 is greater than the protruding width P4 of the gate 122 protruded from the fourth boundary E4 of the channel portion 115 toward the gate line 124. At this point, the first protruding portion 917 is partially located outside the gate 122.

Figure 12:
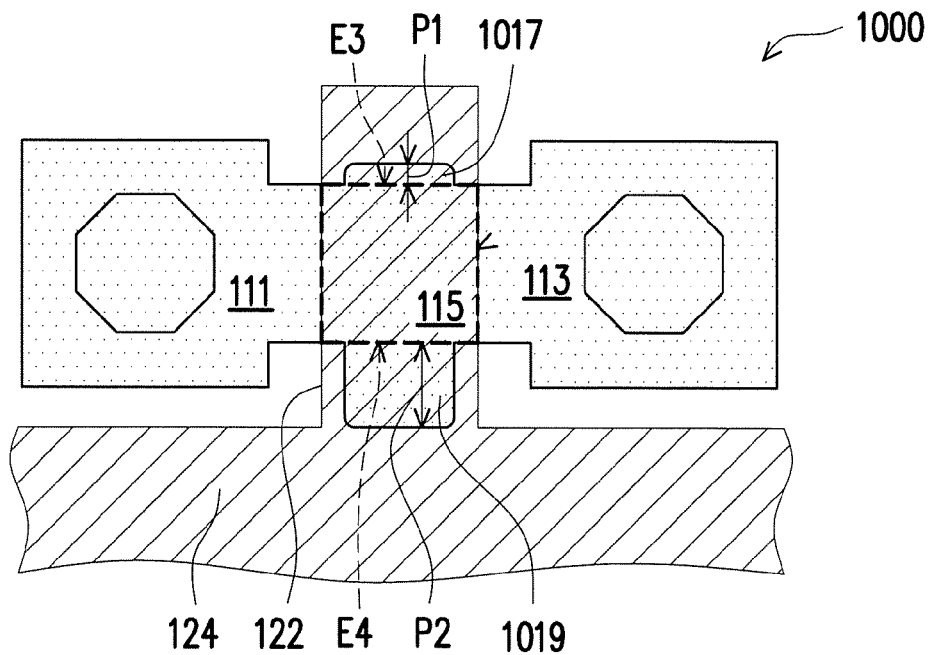
Figure 13:
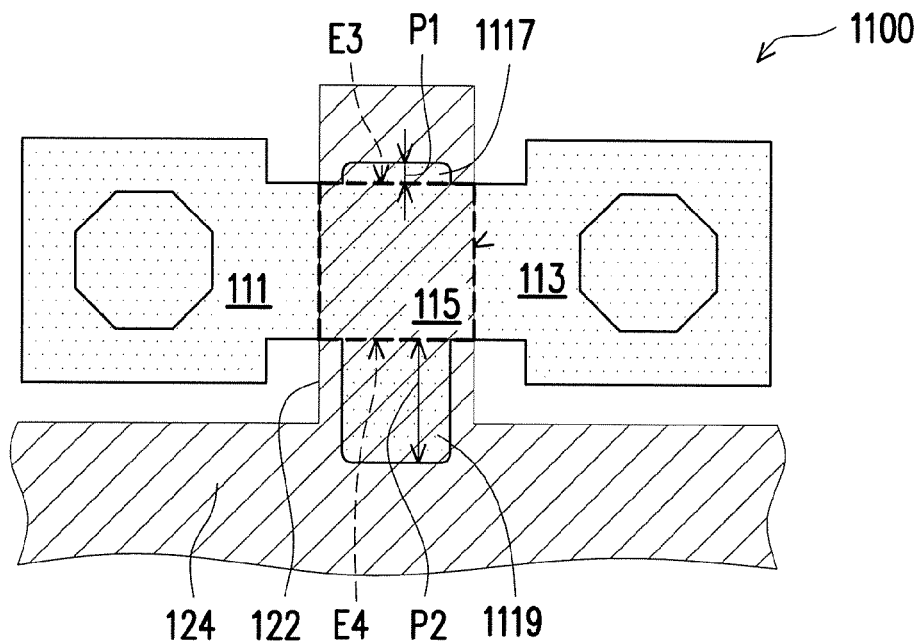

In a transistor device 1000 of FIG. 12, a first protruding portion 1017 and a second protruding portion 1019 are both completely covered by the gate 122, and the protruding width P1 of the first protruding portion 1017 protruded outwardly from the third boundary E3 of the channel portion 115 is less than the protruding width P2 of the second protruding portion 1019 protruded outwardly from the fourth boundary E4 of the channel portion 115. In a transistor device 1100 of FIG. 13, a first protruding portion 1117 and a second protruding portion 1119 are both completely covered by the gate 122, and the protruding width P1 of the first protruding portion 1117 protruded outwardly from the third boundary E3 of the channel portion 115 is less than the protruding width P2 of the second protruding portion 1119 protruded outwardly from the fourth boundary E4 of the channel portion 115. Moreover, the second protruding portion 1119 is extended beyond the junction of the gate 122 and the gate line 124 and partially overlapped with the gate line 124.

Figure 14:
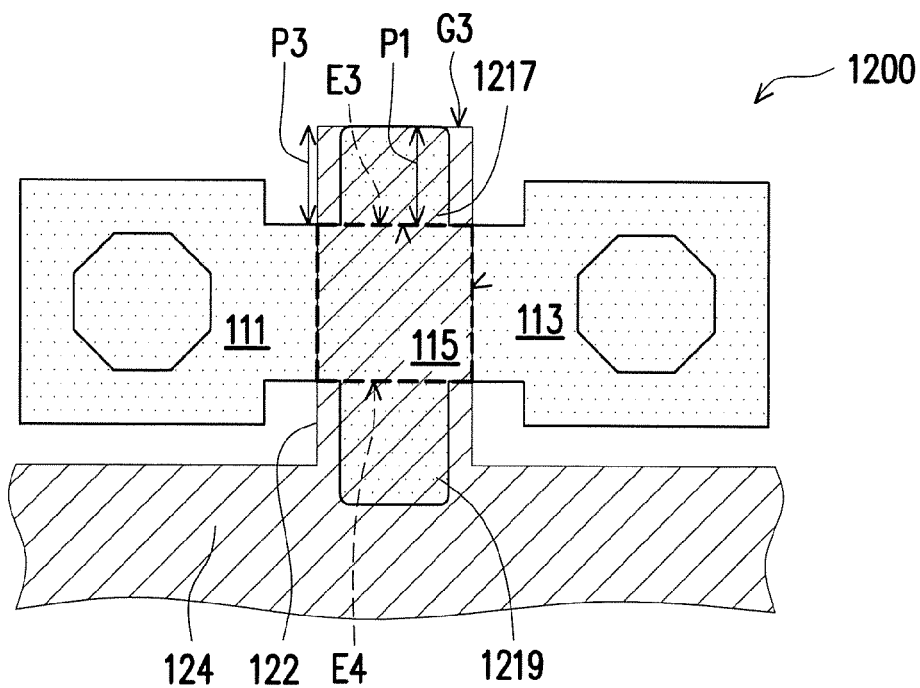

In a transistor device 1200 of FIG. 14, the protruding width P1 of a first protruding portion 1217 protruded outwardly from the third boundary E3 of the channel portion 115 is the same as the protruding width P3 of the gate 122 protruded outwardly from the third boundary E3 of the channel portion 115. Therefore, a portion of the boundary of the first protruding portion 1217 at an end is overlapped with the third gate boundary G3 of the gate 122. Moreover, the connection lengths of the first protruding portion 1217 connected to the third boundary E3 and a second protruding portion 1219 connected to the fourth boundary E4 are respectively less than the lengths of the third boundary E3 and the fourth boundary E4 of the channel portion 115.

Figure 15:
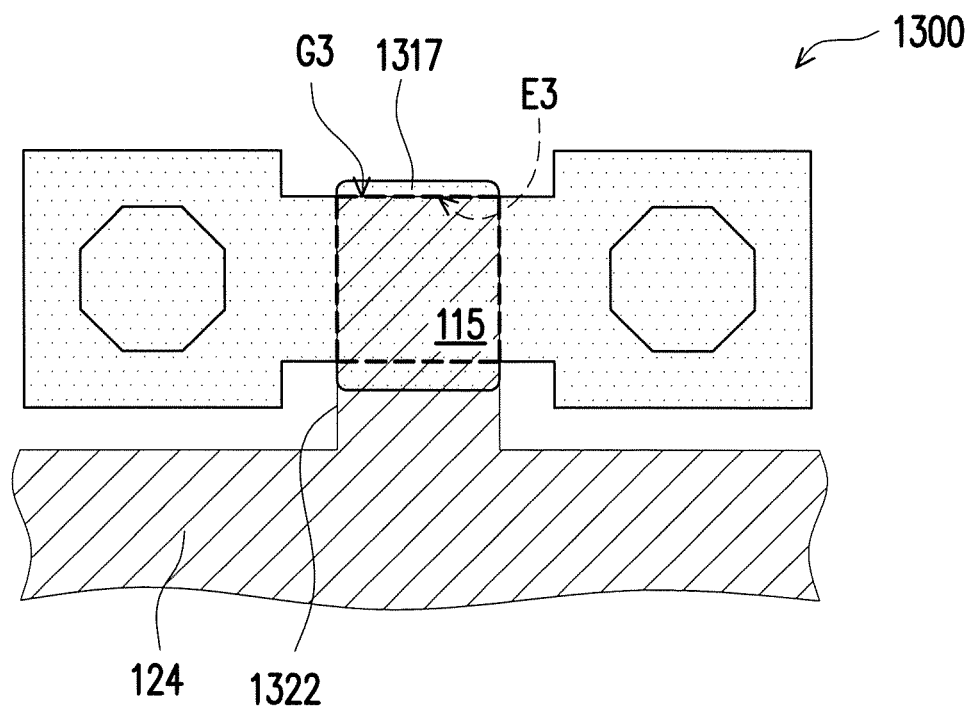
Figure 16:
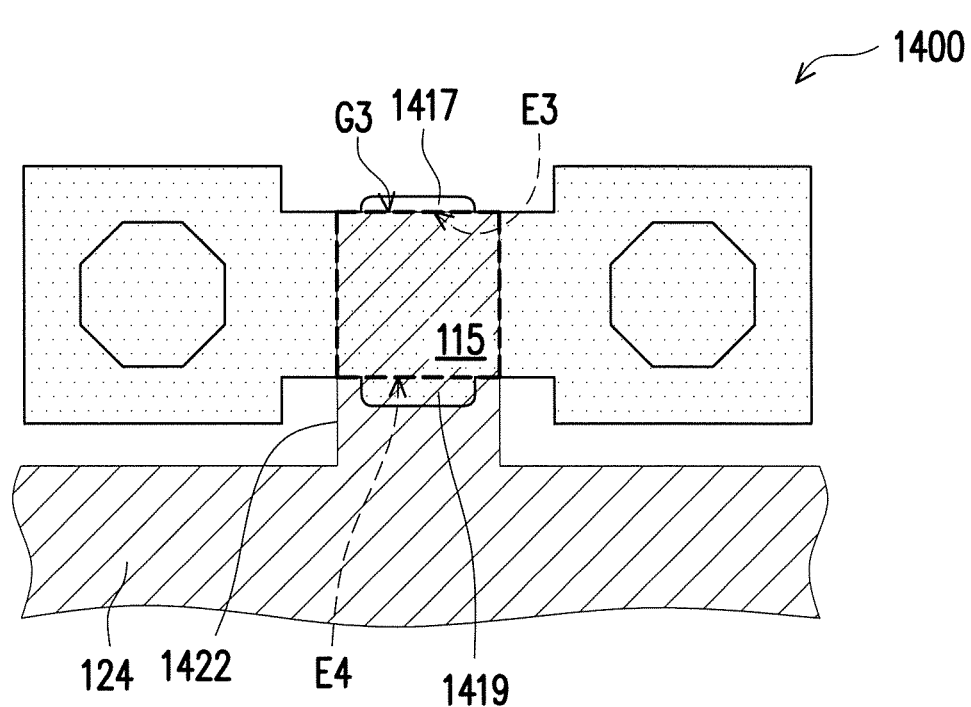

In a transistor device 1300 of FIG. 15, the third gate boundary G3 of a gate 1322 is substantially overlapped with the third boundary E3 of the channel portion 115, and therefore a first protruding portion 1317 is protruded outwardly from the third boundary E3 and the third gate boundary G3 and not overlapped with the gate 1322. In a transistor device 1400 of FIG. 16, the connection length of a first protruding portion 1417 connected to the third boundary E3 is less than the third boundary E3 of the channel portion 115, and the connection length of a second protruding portion 1419 connected to the fourth boundary E4 is less than the fourth boundary E4 of the channel portion 115. Moreover, the third gate boundary G3 of a gate 1422 is substantially overlapped with the third boundary E3 of the channel portion 115, and therefore the first protruding portion 1417 is protruded outwardly from the third boundary E3 and the third gate boundary G3 and not overlapped with the gate 1422.

Figure 17:
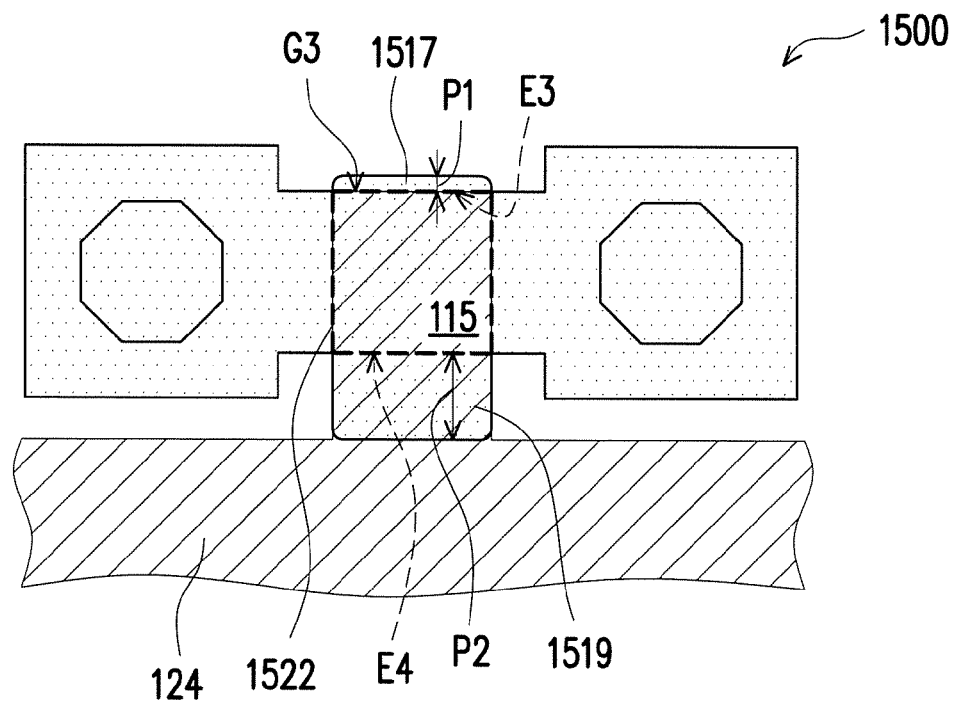
Figure 18:
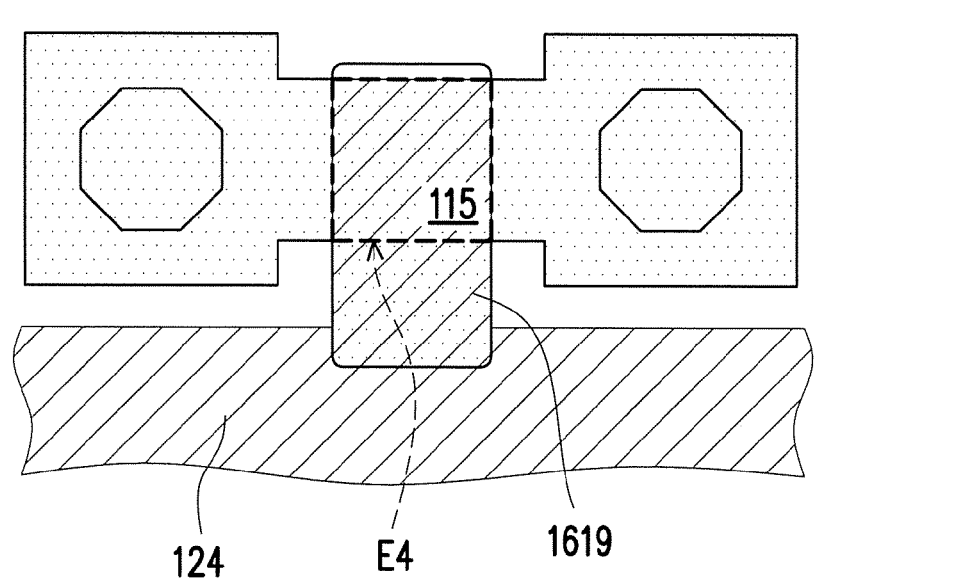
Figure 19:
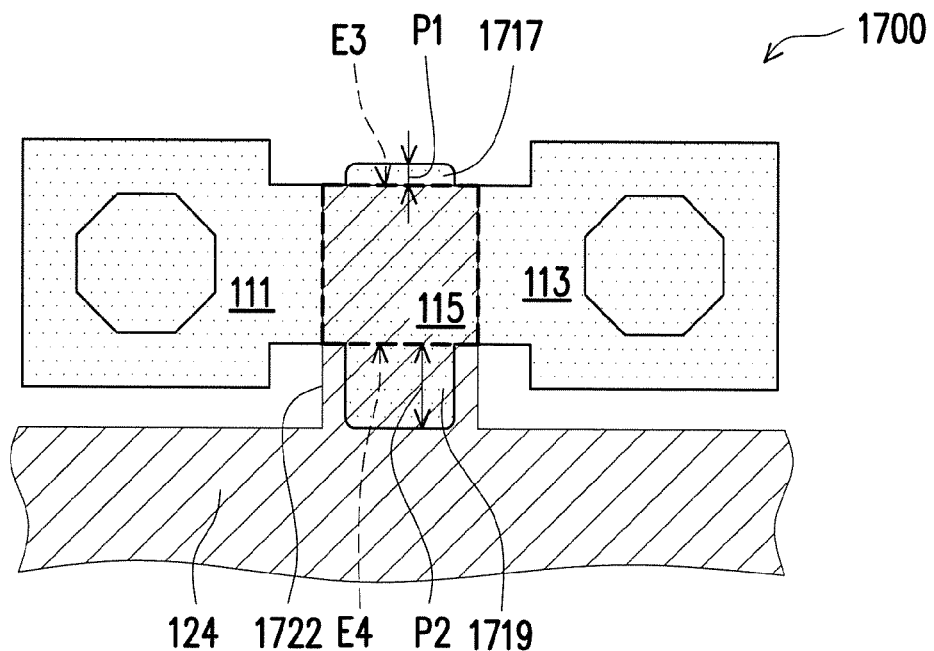
Figure 20:
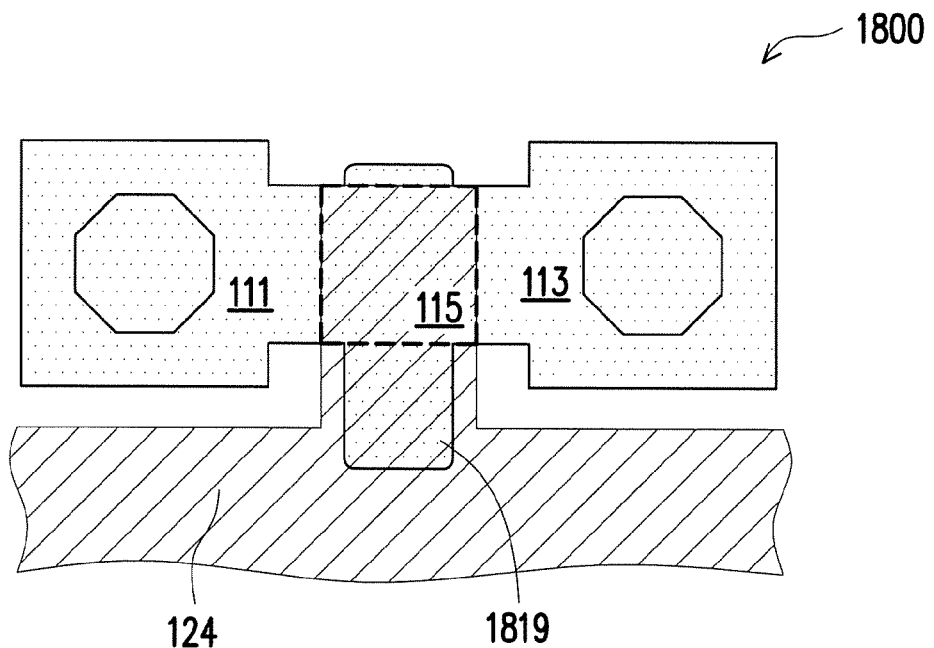

In a transistor device 1500 of FIG. 17, the protruding width P2 of a second protruding portion 1519 protruded outwardly from the fourth boundary E4 of the channel portion 115 is greater than the protruding width P1 of a first protruding portion 1517 protruded outwardly from the third boundary E3 of the channel portion 115. Moreover, the third gate boundary G3 of a gate 1522 is overlapped with the third boundary E3 of the channel portion 115, such that the first protruding portion 1517 is not shielded by the gate 1522. A transistor device 1600 of FIG. 18 is similar to the transistor device of FIG. 17, but a second protruding portion 1619 of the transistor device 1600 is extended toward the gate line 124 and partially overlapped with the gate line 124. A transistor device 1700 of FIG. 19 is similar to the transistor device 1500 of FIG. 17, but the connection length of a first protruding portion 1717 of the transistor device 1700 connected to the third boundary E3 is less than the third boundary E3 of the channel portion 115 and the connection length of a second protruding portion 1719 connected to the fourth boundary E4 is less than the fourth boundary E4 of the channel portion. Here, the protruding width P2 of the second protruding portion 1719 protruded outwardly from the fourth boundary E4 of the channel portion 115 is greater than the protruding width P1 of the first protruding portion 1717 protruded outwardly from the third boundary E3 of the channel portion 115. At the same time, the third gate boundary G3 of a gate 1722 is overlapped with the third boundary E3 of the channel portion 115, such that the first protruding portion 1717 is not shielded by the gate 1522. A transistor device 1800 of FIG. 20 is similar to the transistor device 1700 of FIG. 19, but a second protruding portion 1819 of the transistor device 1800 is extended toward the gate line 124 to be partially overlapped with the gate line 124.

Figure 21:
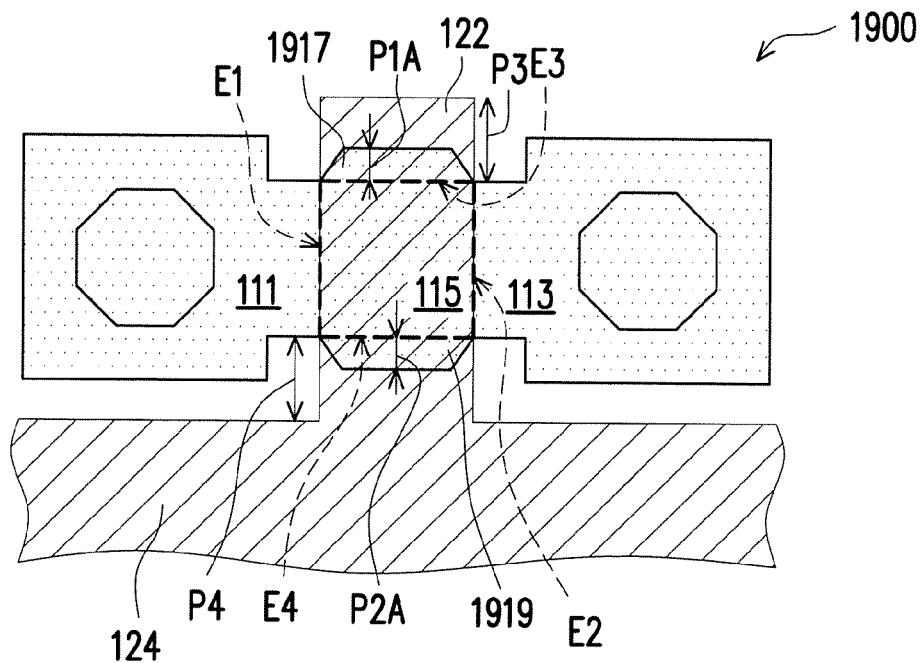

In a transistor device 1900 of FIG. 21, a protruding width P1A (the first protruding width) of a first protruding portion 1917 protruded from the third boundary E3 of the channel portion 115 is a non-uniformed width, and a protruding width P2A (the second protruding width) of a second protruding portion 1919 protruded from the fourth boundary E4 of the channel portion 115 is also a non-uniformed width. The variation of the protruding width P1A from the first boundary E1 of the channel portion 115 toward the second boundary E2 includes first increasing, then maintaining a constant value, and then decreasing, and the variation of the protruding width P2A from the first boundary E1 of the channel portion 115 toward the second boundary E2 also similarly includes first increasing, then maintaining a constant value, and then decreasing. Therefore, the first protruding portion 1917 and the second protruding portion 1919 are trapezoids. Moreover, the maximum value of the width P1A is less than the protruding width P3 of the gate 122 protruded outwardly from the third boundary E3 of the channel portion 115, and the maximum value of the width P2A is less than the protruding width P4 of the gate 122 protruded from the fourth boundary E4 of the channel portion 115 toward the gate line 124.

Figure 22:
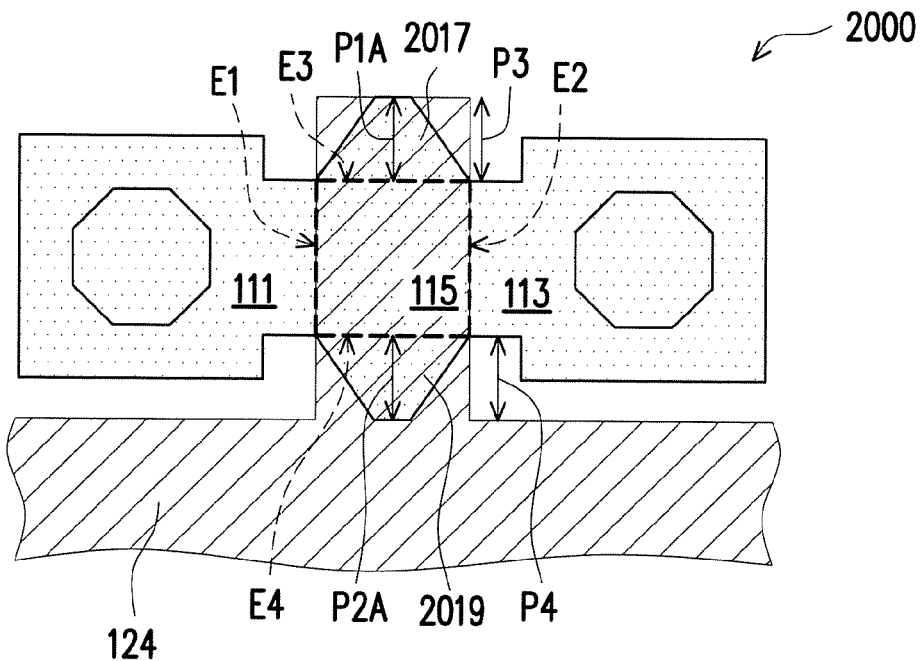

In a transistor device 2000 of FIG. 22, the protruding width P1A of a first protruding portion 2017 protruded from the third boundary E3 of the channel portion 115 is a non-uniformed width, and the protruding width P2A of a second protruding portion 2019 protruded from the fourth boundary E4 of the channel portion 115 is also a non-uniformed width. The variations of the protruding width P1A and the protruding width P2A from the first boundary E1 of the channel portion 115 toward the second boundary E2 are both first increasing, then maintaining a constant value, and then decreasing. Therefore, the first protruding portion 2017 and the second protruding portion 2019 are trapezoids. Moreover, the maximum value of the width PIA is equal to the protruding width P3 of the gate 122 protruded outwardly from the third boundary E3 of the channel portion 115, and the maximum value of the width P2A is equal to the protruding width P4 of the gate 122 protruded from the fourth boundary E4 of the channel portion 115 toward the gate line 124.

Figure 23:
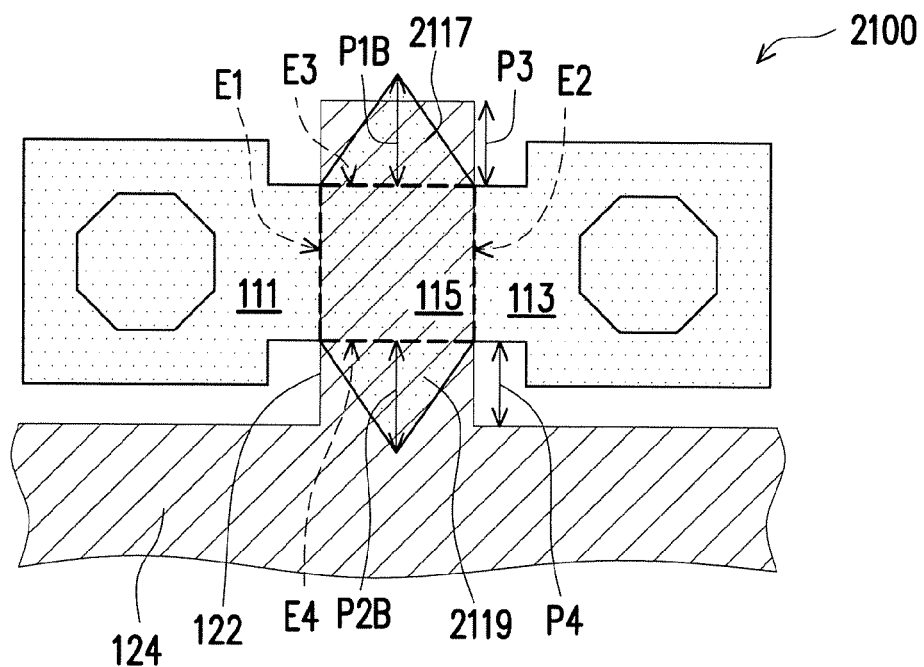

In a transistor device 2100 of FIG. 23, a protruding width P1B of a first protruding portion 2117 protruded from the third boundary E3 of the channel portion 115 is a non-uniformed width, and a protruding width P2B of a second protruding portion 2119 protruded from the fourth boundary E4 of the channel portion 115 is also a non-uniformed width. The variations of the protruding width P1B and the protruding width P2B from the first boundary E1 of the channel portion 115 toward the second boundary E2 are both first linearly increasing and then linearly decreasing. Therefore, the first protruding portion 2017 and the second protruding portion 2019 are triangles. In the present embodiment, the maximum value of the width P1B could be greater than the protruding width P3 of the gate 122 protruded outwardly from the third boundary E3 of the channel portion 115, and the maximum value of the protruding width P2B could be greater than the protruding width P4 of the gate 122 protruded from the fourth boundary E4 of the channel portion 115 toward the gate line 124.

Figure 24:
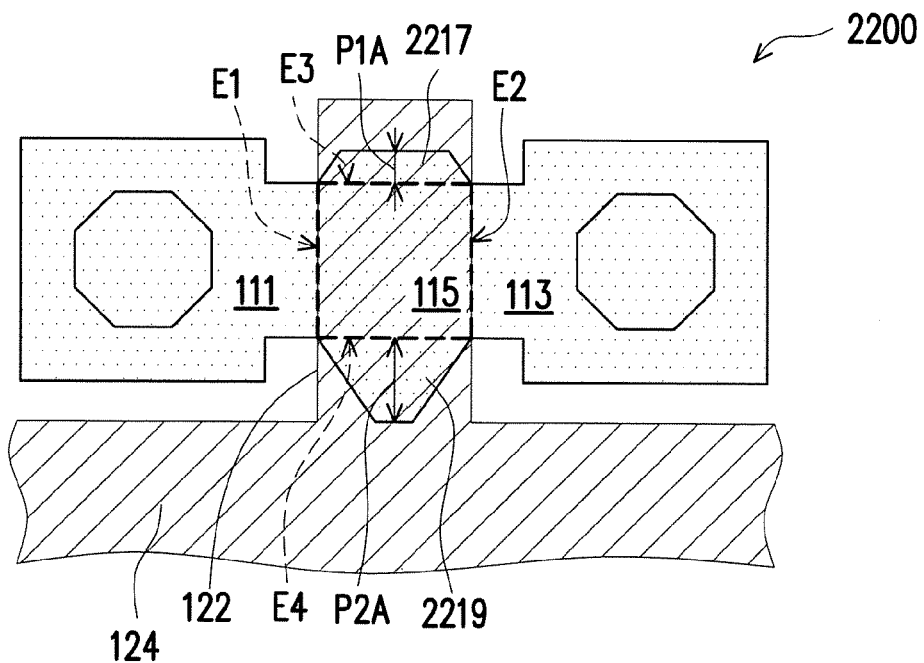

In a transistor device 2200 of FIG. 24, the protruding width P1A of a first protruding portion 2217 protruded from the third boundary E3 of the channel portion 115 is a non-uniformed width, and the protruding width P2A of a second protruding portion 2219 protruded from the fourth boundary E4 of the channel portion 115 is also a non-uniformed width. The variations of the protruding width P1A and the protruding width P2A from the first boundary E1 of the channel portion 115 toward the second boundary E2 are both first increasing, then maintaining a constant value, and then decreasing. Therefore, the first protruding portion 2217 and the second protruding portion 2219 are trapezoids. Moreover, the maximum value of the protruding width P1A is less than the maximum value of the protruding width P2A.

Figure 25:
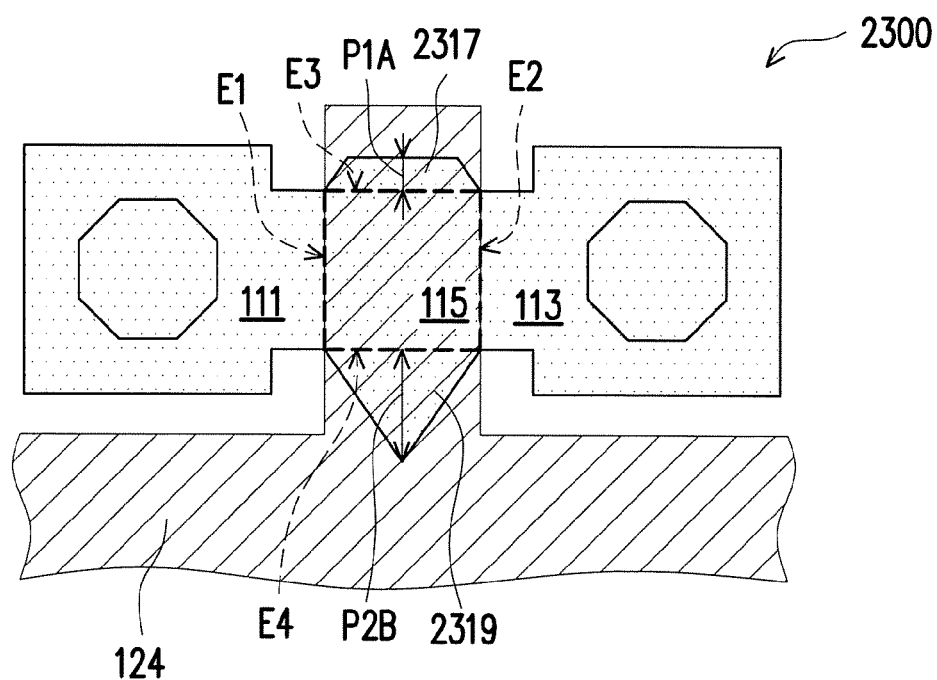

In a transistor device 2300 of FIG. 25, the protruding width P1A of a first protruding portion 2317 protruded from the third boundary E3 of the channel portion 115 is a non-uniformed width, and the protruding width P2B of a second protruding portion 2319 protruded from the fourth boundary E4 of the channel portion 115 is also a non-uniformed width. The variation of the protruding width P1A from the first boundary E1 of the channel portion 115 toward the second boundary E2 is first increasing, then maintaining a constant value, and then decreasing, and the variation of the protruding width P2B from the first boundary E1 of the channel portion 115 toward the second boundary E2 is first linearly increasing and then linearly decreasing. Therefore, the first protruding portion 2317 is a trapezoid and the second protruding portion 2319 is a triangle. Moreover, the maximum value of the protruding width PIA is less than the maximum value of the protruding width P2A.

Figure 26:
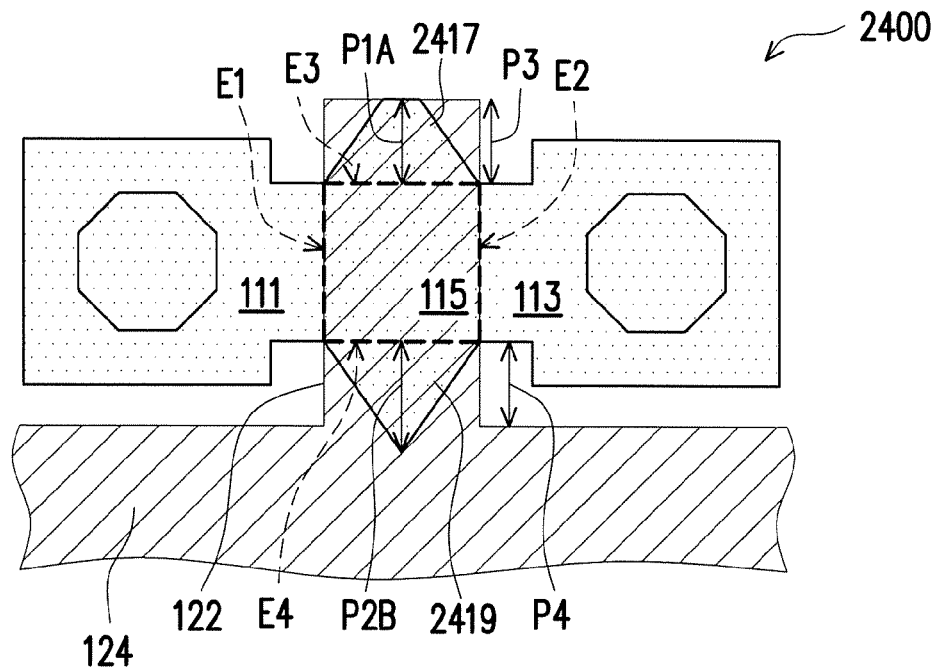

In a transistor device 2400 of FIG. 26, the protruding width P1A of a first protruding portion 2417 protruded from the third boundary E3 of the channel portion 115 is a non-uniformed width, and the protruding width P2B of a second protruding portion 2419 protruded from the fourth boundary E4 of the channel portion 115 is also a non-uniformed width. The variation of the protruding width P1A from the first boundary E1 of the channel portion 115 toward the second boundary E2 is first increasing, then maintaining a constant value, and then decreasing, and the variation of the protruding width P2B from the first boundary E1 of the channel portion 115 toward the second boundary E2 is first linearly increasing and then linearly decreasing. Therefore, the first protruding portion 2417 is a trapezoid and the second protruding portion 2419 is a triangle. Moreover, the maximum value of the protruding width PIA is substantially equal to the protruding width P3 of the gate 122 protruded outwardly from the third boundary E3 of the channel portion 115 such that the boundary of the gate 122 at the end is overlapped with the boundary of the first protruding portion 2417 at the end. The maximum value of the protruding width P2B is greater than the protruding width P4 of the gate 122 protruded from the fourth boundary E4 of the channel portion 115 toward the gate line 124.

Figure 27:
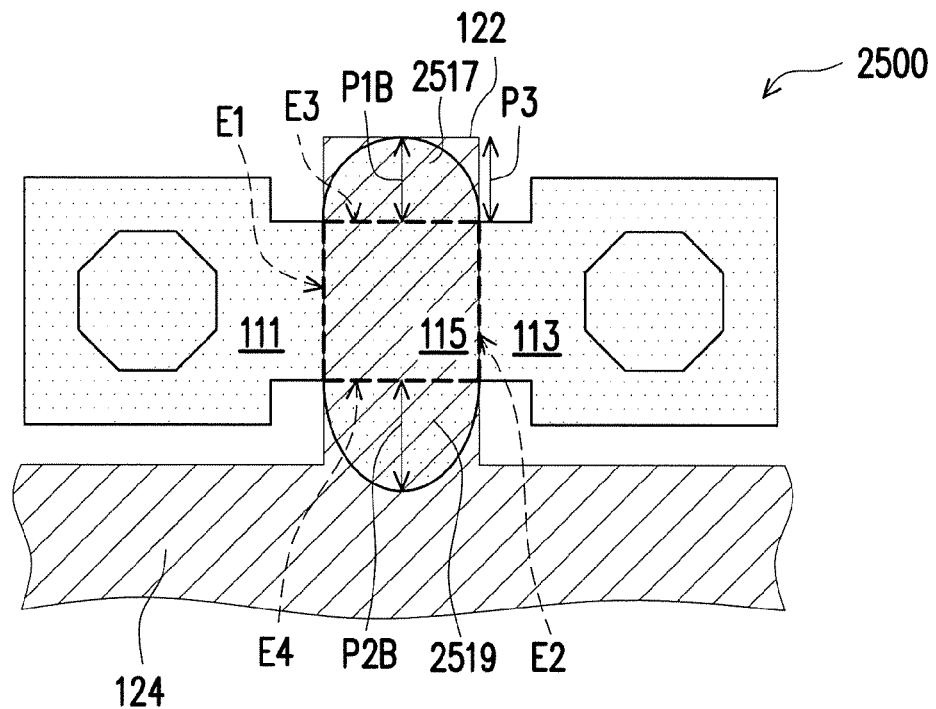
Figure 28:
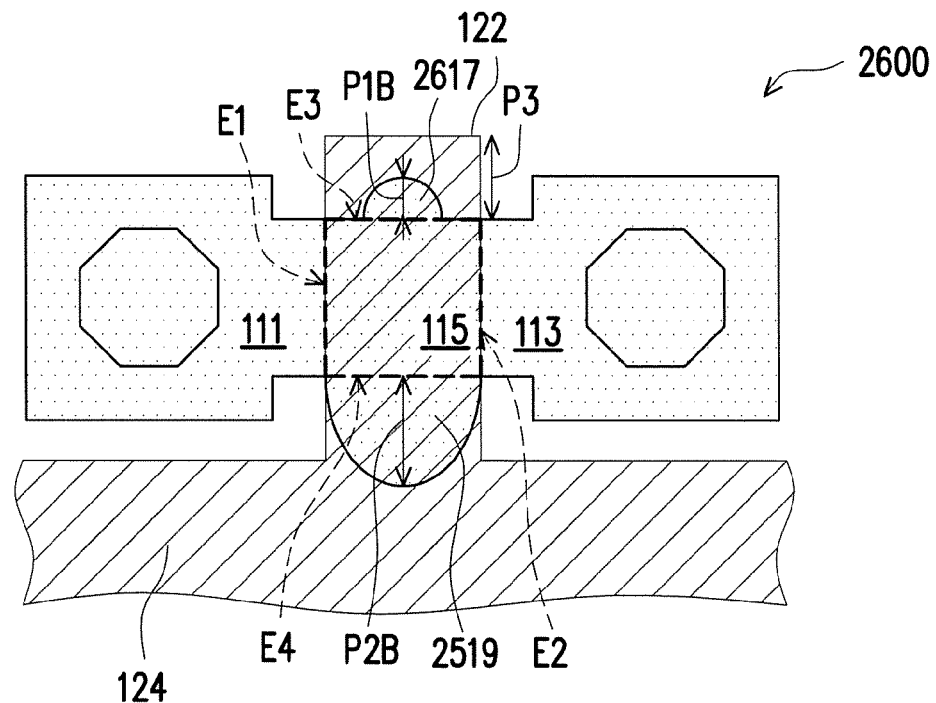

In a transistor device 2500 of FIG. 27, the protruding width P1B of a first protruding portion 2517 protruded from the third boundary E3 of the channel portion 115 is a non-uniformed width, and the protruding width P2B of a second protruding portion 2519 protruded from the fourth boundary E4 of the channel portion 115 is also a non-uniformed width. The variations of the protruding width P1B and the protruding width P2B from the first boundary E1 of the channel portion 115 toward the second boundary E2 are both first non-linearly increasing and then non-linearly decreasing. Therefore, the first protruding portion 2517 and the second protruding portion 2519 are roughly semi-circular. In the present embodiment, the maximum value of the width P1B could be equal to the protruding width P3 of the gate 122 protruded outwardly from the third boundary E3 of the channel portion 115, and the maximum value of the width P2B could be greater than the protruding width P4 of the gate 122 protruded from the fourth boundary E4 of the channel portion 115 toward the gate line 124. A transistor device 2600 of FIG. 28 is similar to the transistor device 2500 of FIG. 27, but the connection length of a first protruding portion 2617 of the transistor device 2600 connected to the third boundary E3 is less than the length of the third boundary E3 of the channel portion 115, and the maximum value of the protruding width P1B of the first protruding portion 2617 protruded from the third boundary E3 of the channel portion 115 could be less than the protruding width P3 of the gate 122 protruded outwardly from the third boundary E3 of the channel portion 115.

Figure 29:
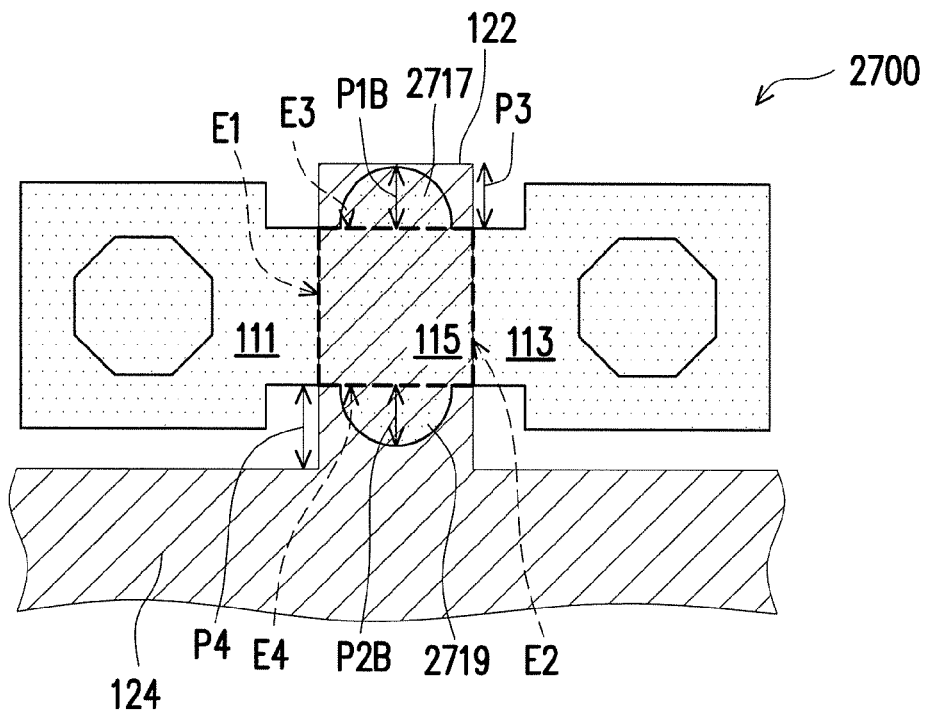

In a transistor device 2700 of FIG. 29, the protruding width P1B of a first protruding portion 2717 protruded from the third boundary E3 of the channel portion 115 is a non-uniformed width, and the protruding width P2B of a second protruding portion 2719 protruded from the fourth boundary E4 of the channel portion 115 is also a non-uniformed width. The variations of the protruding width P1B and the protruding width P2B from the first boundary E1 of the channel portion 115 toward the second boundary E2 are both first non-linearly increasing and then non-linearly decreasing. Therefore, the first protruding portion 2717 and the second protruding portion 2719 are roughly semi-circular. In the present embodiment, the maximum value of the width P1B could be equal to the protruding width P3 of the gate 122 protruded outwardly from the third boundary E3 of the channel portion 115, and the maximum value of the width P2B could be less than the protruding width P4 of the gate 122 protruded from the fourth boundary E4 of the channel portion 115 toward the gate line 124. Moreover, the connection length of the first protruding portion 2717 connected to the third boundary E3 is less than the length of the third boundary E3 of the channel portion 115, and the connection length of the second protruding portion 2719 connected to the fourth boundary E4 is less than the length of the fourth boundary E4 of the channel portion 115.

Figure 30:
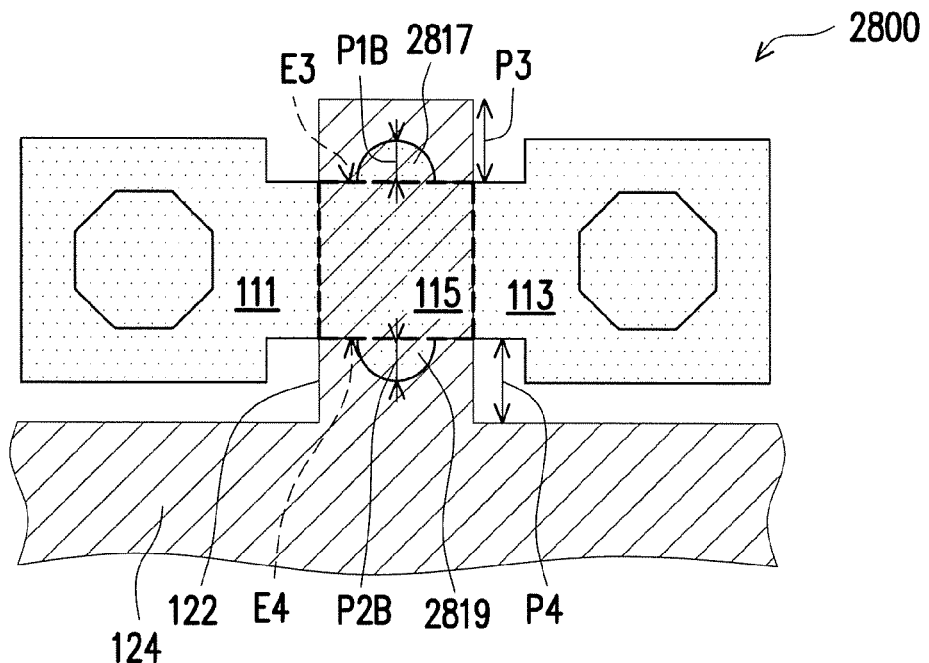

In a transistor device 2800 of FIG. 30, a first protruding portion 2817 and a second protruding portion 2819 are roughly semi-circular. In the present embodiment, the maximum value of the width P1B is less than the protruding width P3 of the gate 122 protruded outwardly from the third boundary E3 of the channel portion 115, and the maximum value of the width P2B is also less than the protruding width P4 of the gate 122 protruded from the fourth boundary E4 of the channel portion 115 toward the gate line 124. Moreover, the connection length of the first protruding portion 2717 connected to the third boundary E3 is less than the length of the third boundary E3 of the channel portion 115, and the connection length of the second protruding portion 2719 connected to the fourth boundary E4 is less than the length of the fourth boundary E4 of the channel portion 115.

Figure 31:
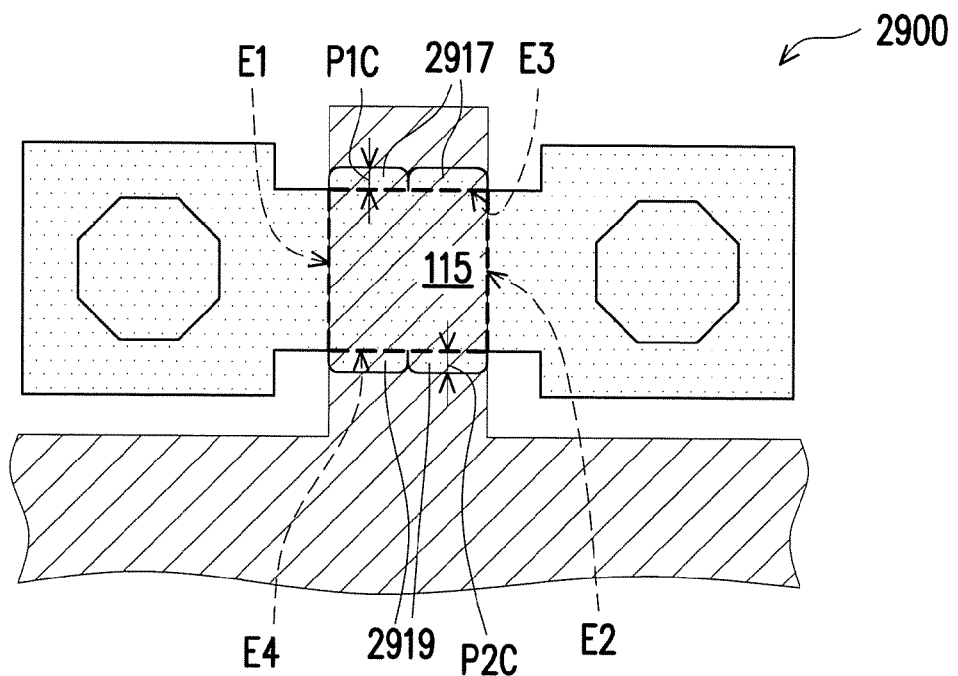

In a transistor device 2900 of FIG. 31, a protruding width P1C of a first protruding portion 2917 protruded from the third boundary E3 of the channel portion 115 is a non-uniformed width, and a protruding width P2C of a second protruding portion 2919 protruded from the fourth boundary E4 of the channel portion 115 is also a non-uniformed width. The variations of the protruding width P1C and the protruding width P2C from the first boundary E1 of the channel portion 115 toward the second boundary E2 are both first increasing, then maintaining a constant value, decreasing, increasing, maintaining a constant value, and decreasing. Therefore, the first protruding portion 2917 and the second protruding portion 2919 are roughly bimodal.

Figure 32:
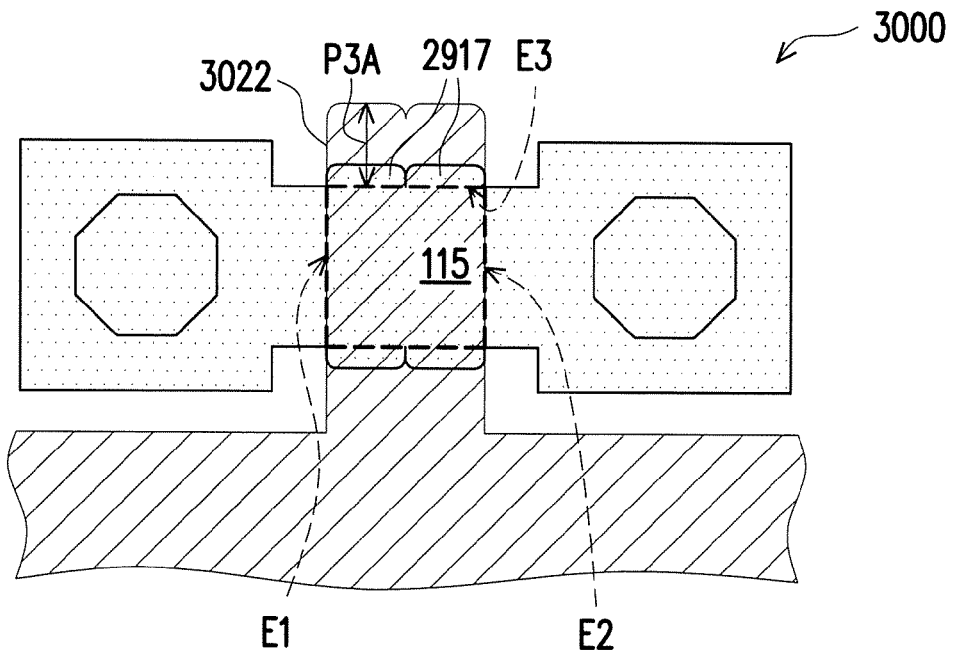

A transistor device 3000 of FIG. 32 is similar to the transistor device 3000 of FIG. 31, but in the transistor device 3000, a protruding width P3A of a gate 3022 protruded outwardly from the third boundary E3 of the channel portion 115 is a non-uniformed width, and the variation of the protruding width P3A from the first boundary E1 of the channel portion 115 toward the second boundary E2 is always first increasing, then maintaining a constant value, decreasing, increasing, maintaining a constant value, and decreasing. Therefore, the gate 3022 has a bimodal appearance.

Figure 33:
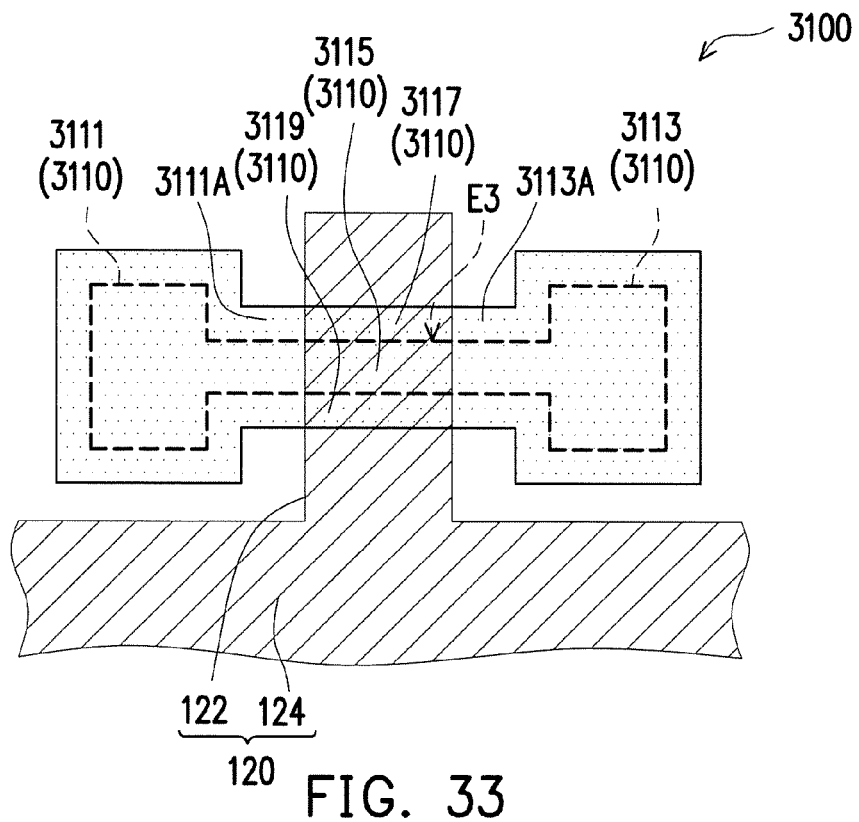

In a transistor device 3100 of FIG. 33, in addition to a first conductive portion 3111, a second conductive portion 3113, a channel portion 3115, a first protruding portion 3117, and a second protruding portion 3119, a semiconductor material layer 3110 further includes a first low-conductivity portion 3111A and a second low-conductivity portion 3113A. The first low-conductivity portion 3111A is located in the periphery of the first conductive portion 3111, and the second low-conductivity portion 3113A is located in the periphery of the second conductive portion 3113. Neither of the first low-conductivity portion 3111A nor the second low-conductivity portion 3113A is overlapped with the gate layer 120. The boundaries of the first low-conductivity portion 3111A and the second low-conductivity portion 3113A form a portion of the boundary of the semiconductor material layer 3110.

Specifically, the first conductive portion 3111, the second conductive portion 3113, the channel portion 3115, the first protruding portion 3117, the second protruding portion 3119, the first low-conductivity portion 3111A, and the second low-conductivity portion 3113A could be formed by performing a selective doping procedure on a single semi-conductor island object, wherein in the selective doping procedure, only the first conductive portion 3111 and the second conductive portion 3113 are doped. The doping concentration of each of the first conductive portion 3111 and the second conductive portion 3113 is greater than the doping concentration of each of the first low-conductivity portion 3111A, the second low-conductivity portion 3113A, the channel portion 3115, the first protruding portion 3117, and the second protruding portion 3119. Moreover, the gate 122 of the gate layer 120 covers the channel portion 3115 and is further extended outward from the third boundary E3 of the channel portion 3115 beyond the first protruding portion 3117. Here, the boundaries of the first protruding portion 3117 and the second protruding portion 3119 could be collinear with the boundaries of the first low-conductivity portion 3111A and the second low-conductivity portion 3113A.

Figure 34:
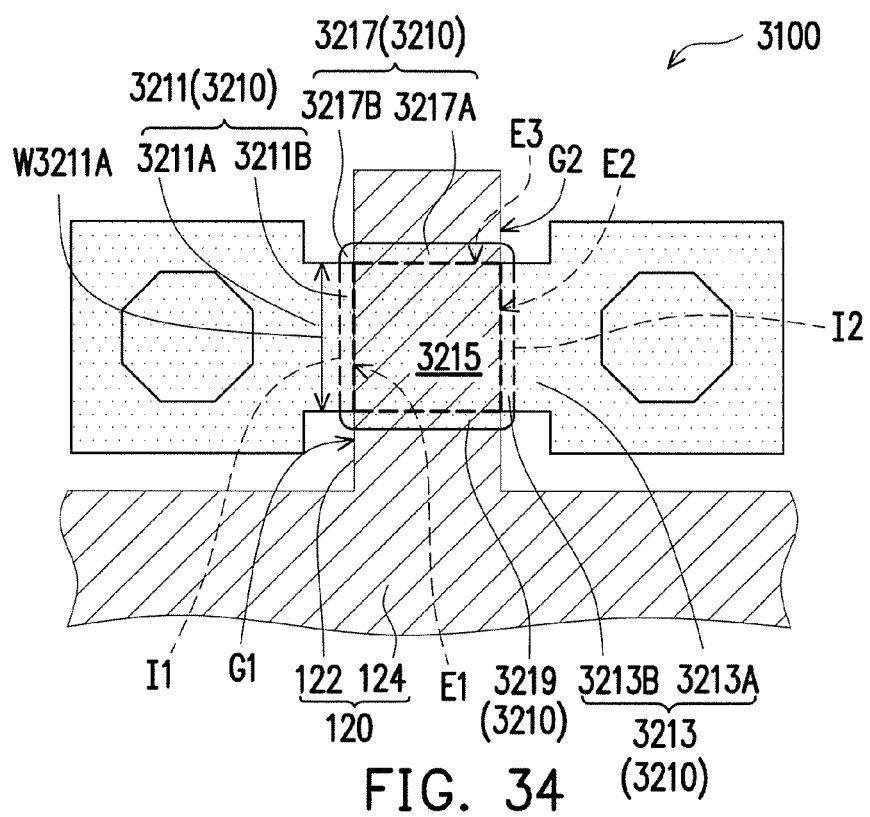

In the above embodiments, the first protruding portion does not exceed the third boundary of the channel portion and the second protruding portion does not exceed the fourth boundary of the channel portion as an example, but the disclosure is not limited thereto. Using FIG. 34 as an example, a transistor device 3200 is substantially obtained by changing the semiconductor device of FIG. 1, wherein the gate layer 120 is labeled by the same reference numeral. In the transistor device 3200, a semiconductor material layer 3210 includes a first conductive portion 3211, a second conductive portion 3213, a channel portion 3215, and a first protruding portion 3217 and a second protruding portion 3219. The first conductive portion 3211 includes a first necking region 3211A and a first connecting region 3211B. The first connecting region 3211B is located between the first necking region 3211A and the channel portion 3215. The second conductive portion 3213 also has a similar design to the first conductive portion 3211 and includes a second necking region 3213A and a second connecting region 3213B. The first protruding portion 3217 includes a first inwardly-protruding region 3217A and a first outwardly-protruding region 3217B connected to each other, wherein the first inwardly-protruding region 3217A is protruded outwardly from the third boundary E3 of the channel portion 3215 and the first outwardly-protruding region 3217B is protruded outwardly from the first connecting region 3211B of the first conductive portion 3211, such that the first outwardly-protruding region 3217B is located outside the area of the gate layer 120. The second protruding portion 3219 also has a structural design similar to the first protruding portion 3217. The first protruding portion 3217 is protruded outwardly from the channel portion 3215 such that the slope variation caused by the structure of the boundary of the first protruding portion 3217 does not affect the performance of the channel portion 3215. The second protruding portion 3219 also provides a similar function.

Since current flows in a way of the shortest distance when the transistor device 3200 is enabled, the first necking region 3211A is relatively narrower in the first conductive portion 3211 such that current distribution is limited by a width W3211A of the first necking region 3211A. That is, when the transistor device 3200 is enabled, the current density flowing through the first connecting region 3211B could be greater than the current density flowing through the first outwardly-protruding region 3217B. Therefore, the first boundary E1 of the channel portion 3215 could be defined by the projection line formed by the projection of a junction I1 of the first connecting region 3211B and the first necking region 3211A to the first gate boundary G1. Moreover, the second boundary E2 of the channel portion 3215 could be defined by the projection line formed by the projection of a junction I2 of the second connecting region 3213B and the second necking region 3213A to the second gate boundary G2.

Figure 35:
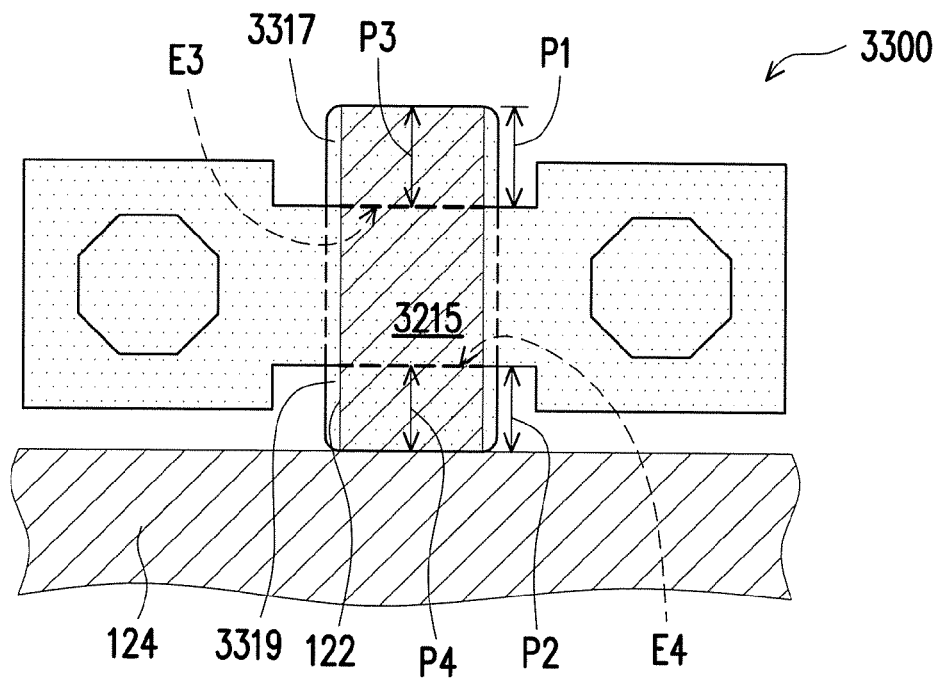

A transistor device 3300 of FIG. 35 is similar to the transistor device 3200, but the boundaries of a first protruding portion 3317 and a second protruding portion 3319 are substantially aligned with the boundary of the gate 122. The protruding width P1 of the first protruding portion 3317 protruded from the third boundary E3 of the channel portion 3215 is equal to the protruding width P3 of the gate 122 protruded outwardly from the third boundary E3 of the channel portion 3215, and the protruding width P2 of the second protruding portion 3319 protruded from the fourth boundary E4 of the channel portion 3215 is equal to the protruding width P4 of the gate 122 protruded outwardly from the fourth boundary E4 of the channel portion 3215 to the gate line 124.

Figure 36:
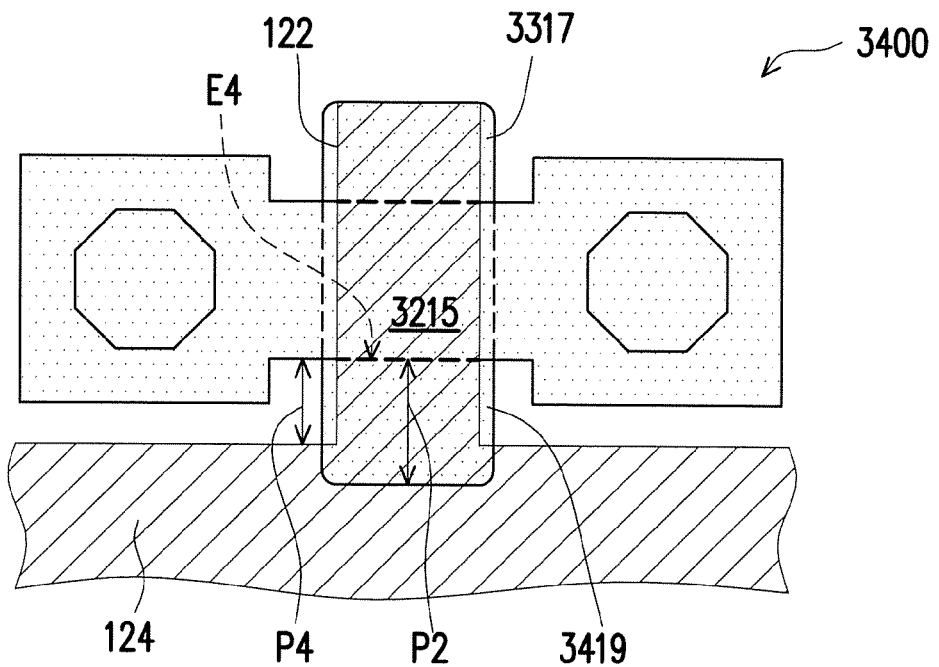
Figure 37:
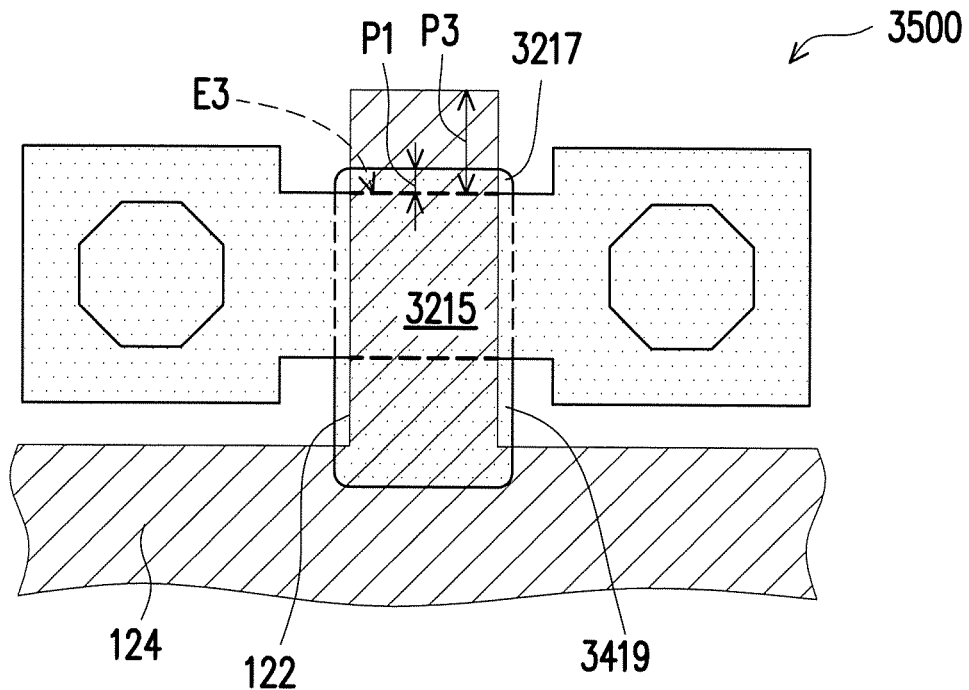
Figure 38:
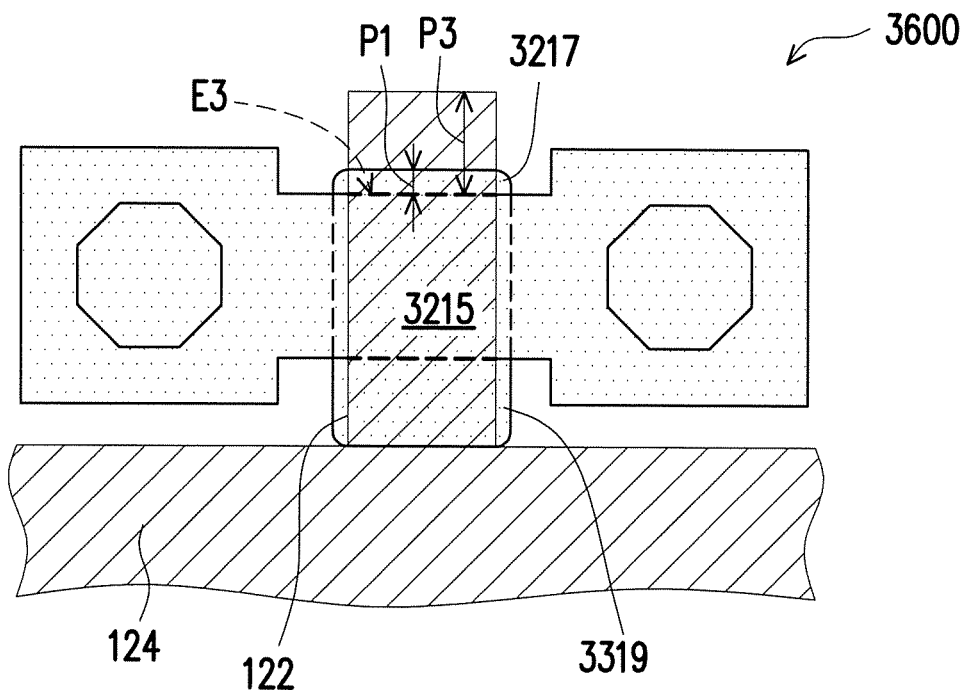

In a transistor device 3400 of FIG. 36, the designs of the first protruding portion 3317 and the gate line 124 are the same in the embodiment of FIG. 35, but the protruding width P2 of a second protruding portion 3419 protruded from the fourth boundary E4 of the channel portion 3215 is greater than the protruding width P4 of the gate 122 protruded outwardly from the fourth boundary E4 of the channel portion 3215 to the gate line 124. Therefore, the second protruding portion 3419 is partially overlapped with the gate line 124. In a transistor device 3500 of FIG. 37, the designs of the second protruding portion 3419 and the gate line 124 are the same in the embodiment of FIG. 36, but the protruding width P1 of the first protruding portion 3217 protruded from the third boundary E3 of the channel portion 3215 is less than the protruding width P3 of the gate 122 protruded outwardly from the third boundary E3 of the channel portion 3215. In a transistor device 3600 of FIG. 38, the designs of the second protruding portion 3319 and the gate line 124 are the same in the embodiment of FIG. 35, but the protruding width P1 of the first protruding portion 3217 protruded from the third boundary E3 of the channel portion 3215 is less than the protruding width P3 of the gate 122 protruded outwardly from the third boundary E3 of the channel portion 3215.

Based on the above, in the transistor device of an embodiment of the disclosure, the physical contour of the semiconductor material layer is greater than the contour of the channel portion used as the channel, and therefore when the transistor device subjects to stress, a corresponding stress concentration region could be farther away from the channel portion to prevent the performance of the transistor device from being affected by stress. Specifically, the transistor device of an embodiment of the disclosure could be applied in a flexible product to alleviate or inhibit potential changes to the performance of the transistor device when the flexible product is bent.

It will be apparent to those skilled in the art that various modifications and variations could be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A transistor device, comprising:
a semiconductor material layer, comprising a first conductive portion, a second conductive portion, a channel portion, and a first protruding portion formed integrally, wherein the channel portion is located between the first conductive portion and the second conductive portion, the channel portion has a first boundary, a second boundary, a third boundary, and a fourth boundary, the first boundary is at a junction of the first conductive portion and the channel portion, the second boundary is at a junction of the second conductive portion and the channel portion, the third boundary and the fourth boundary connect terminals of the first boundary and the second boundary, and the first protruding portion is protruded outwardly from the third boundary of the channel portion, wherein the semiconductor material layer further comprises a second protruding portion, and the channel portion is located between the first protruding portion and the second protruding portion;
a gate layer extended across and overlapped with the channel portion, wherein a first gate boundary and a second gate boundary of the gate layer are overlapped with the first boundary and the second boundary of the channel portion; and
an insulating layer disposed between the gate layer and the semiconductor material layer.

2. The transistor device of claim 1, wherein electric conductivities of the first conductive portion and the second conductive portion are better than those of the channel portion and the first protruding portion.

3. The transistor device of claim 1, wherein a connection length of the first protruding portion connected to the third boundary is not greater than a length of the third boundary.

4. The transistor device of claim 1, wherein the gate layer comprises a gate line and a gate, the gate is a branch protruded from the gate line, and the gate is extended across and overlapped with the channel portion.

5. The transistor device of claim 1, wherein the gate layer and the first protruding portion are at least partially overlapped.

6. The transistor device of claim 1, wherein a third gate boundary of the gate layer is overlapped with the third boundary of the channel portion.

7. The transistor device of claim 1, wherein a third gate boundary of the gate layer is overlapped with a boundary of the first protruding portion.

8. The transistor device of claim 1, wherein a boundary of the first protruding portion is a portion of a boundary of the semiconductor material layer.

9. The transistor device of claim 1, wherein the first protruding portion is protruded outwardly from the third boundary by a first protruding width, and the second protruding portion is protruded outwardly from the fourth boundary by a second protruding width.

10. The transistor device of claim 9, wherein the first protruding width and the second protruding width are different.

11. The transistor device of claim 9, wherein at least one of the first protruding width and the second protruding width is a non-uniformed width.

12. The transistor device of claim 9, wherein a variation of at least one of the first protruding width and the second protruding width comprises first increasing then decreasing from the first boundary toward the second boundary.

13. The transistor device of claim 1, wherein a doping concentration of each of the first conductive portion and the second conductive portion is greater than a doping concentration of each of the channel portion and the first protruding portion.

14. The transistor device of claim 1, wherein the semiconductor material layer further comprises a first low-conductivity portion located in a periphery of the first conductive portion and a second low-conductivity portion located in a periphery of the second conductive portion, neither the first low-conductivity portion nor the second low-conductivity portion is overlapped with the gate layer, and boundaries of the first low-conductivity portion and the second low-conductivity portion form a portion of a boundary of the semiconductor material layer.

15. The transistor device of claim 14, wherein a doping concentration of each of the first conductive portion and the second conductive portion is greater than a doping concentration of each of the first low-conductivity portion, the second low-conductivity portion, the channel portion, and the first protruding portion.

16. The transistor device of claim 1, wherein the gate layer covers the channel portion and is further extended outward from the third boundary of the channel portion beyond the first protruding portion.

17. The transistor device of claim 1, wherein the first conductive portion comprises a first necking region and a first connecting region, the first connecting region is located between the first necking region and the channel portion, a projection line formed by a projection of a junction of the first connecting region and the first necking region to the first gate boundary is the first boundary of the channel portion, the first protruding portion comprises a first inwardly-protruding region and a first outwardly-protruding region connected to each other, and the first inwardly-protruding region is protruded outwardly from the third boundary of the channel portion and the first outwardly-protruding region is protruded outwardly from the first connecting region of the first conductive portion.

18. The transistor device of claim 17, wherein the first outwardly-protruding region is located outside an area of the gate layer.

19. The transistor device of claim 17, wherein when the transistor device is enabled, a current density flowing through the first necking region is greater than a current density flowing through the first outwardly-protruding region.

* * * * *